(12) United States Patent
Hattori et al.

(10) Patent No.: US 9,832,877 B2
(45) Date of Patent: Nov. 28, 2017

(54) COLLECTIVE SUBSTRATE FOR RESISTOR DEVICES

(71) Applicant: Murata Manufacturing Co., Ltd., Nagaokakyo-shi, Kyoto-fu (JP)

(72) Inventors: Kazuo Hattori, Nagaokakyo (JP); Isamu Fujimoto, Nagaokakyo (JP); Shinichiro Kuroiwa, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 15/239,943

(22) Filed: Aug. 18, 2016

(65) Prior Publication Data

US 2017/0064834 A1 Mar. 2, 2017

(30) Foreign Application Priority Data

Aug. 26, 2015 (JP) ................... 2015-166914

(51) Int. Cl.
*H05K 7/00* (2006.01)
*H05K 1/18* (2006.01)
(Continued)

(52) U.S. Cl.
CPC ............... *H05K 1/181* (2013.01); *H01C 1/01* (2013.01); *H01C 7/008* (2013.01); *H01G 4/12* (2013.01);
(Continued)

(58) Field of Classification Search
CPC .............. H05K 1/181; H05K 1/0296; H05K 2201/10022; H05K 2201/10015; H05K 2201/1003; H05K 2201/0909; H01G 4/30; H01G 4/12; H01G 4/248; H01C 7/008; H01C 1/01
(Continued)

(56) References Cited

U.S. PATENT DOCUMENTS

2011/0013349 A1* 1/2011 Morikita ............. H05K 1/0218
361/679.02
2011/0249416 A1* 10/2011 Takai ..................... H05K 3/284
361/760

(Continued)

FOREIGN PATENT DOCUMENTS

JP 06-283301 A 10/1994
JP 11-340002 A 12/1999
(Continued)

*Primary Examiner* — Sherman Ng
(74) *Attorney, Agent, or Firm* — Keating & Bennett, LLP

(57) ABSTRACT

A collective substrate for resistor devices includes a base, a first conductive pattern in a to-be-product region and a to-be-cut-away region of the base, and a resistive element in the to-be-product region of the base. The to-be-cut-away region includes a first region adjacent to the to-be-product region in a first direction, and a second region adjacent to the to-be-product region in a second direction. The first conductive pattern includes a first terminal portion connected to the resistive element and disposed in the to-be-product region, a first electrode portion disposed in the first region and larger in area than the first terminal portion, and a first interconnect portion extended from the first terminal portion toward the second region to be connected to the first electrode portion.

17 Claims, 14 Drawing Sheets

(51) Int. Cl.
    *H01G 4/30*            (2006.01)
    *H01G 4/12*            (2006.01)
    *H01G 4/248*          (2006.01)
    *H01C 7/00*            (2006.01)
    *H01C 1/01*            (2006.01)
    *H05K 1/02*            (2006.01)

(52) U.S. Cl.
    CPC ............... *H01G 4/248* (2013.01); *H01G 4/30* (2013.01); *H05K 1/0296* (2013.01); *H05K 2201/0909* (2013.01); *H05K 2201/1003* (2013.01); *H05K 2201/10015* (2013.01); *H05K 2201/10022* (2013.01)

(58) Field of Classification Search
    USPC .......................................................... 361/782
    See application file for complete search history.

(56) References Cited

U.S. PATENT DOCUMENTS

| | | | | |
|---|---|---|---|---|
| 2014/0126157 | A1* | 5/2014 | Sawatari | ............... H01L 23/552 361/728 |
| 2016/0268050 | A1* | 9/2016 | Hattori | ..................... H01G 4/40 |
| 2016/0372265 | A1* | 12/2016 | Hattori | ..................... H01G 4/30 |

FOREIGN PATENT DOCUMENTS

| | | |
|---|---|---|
| JP | 2005-303199 A | 10/2005 |
| JP | 2016-171184 A | 9/2016 |

* cited by examiner

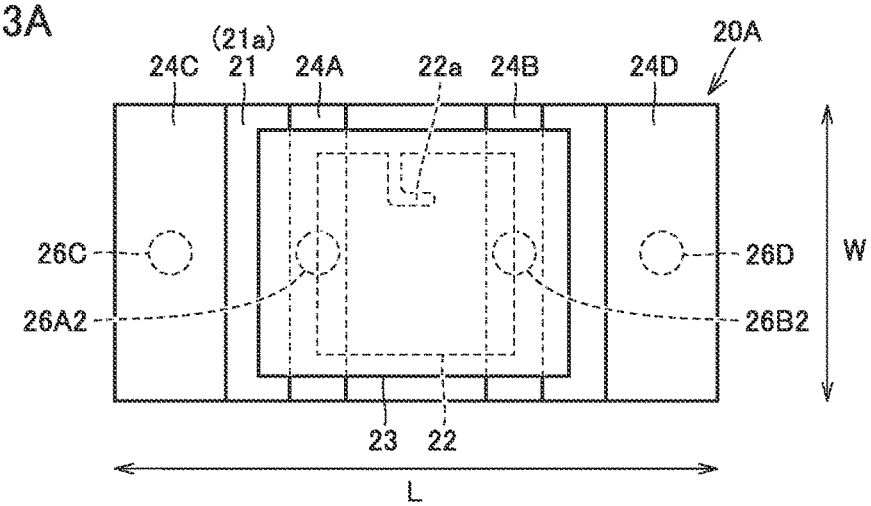
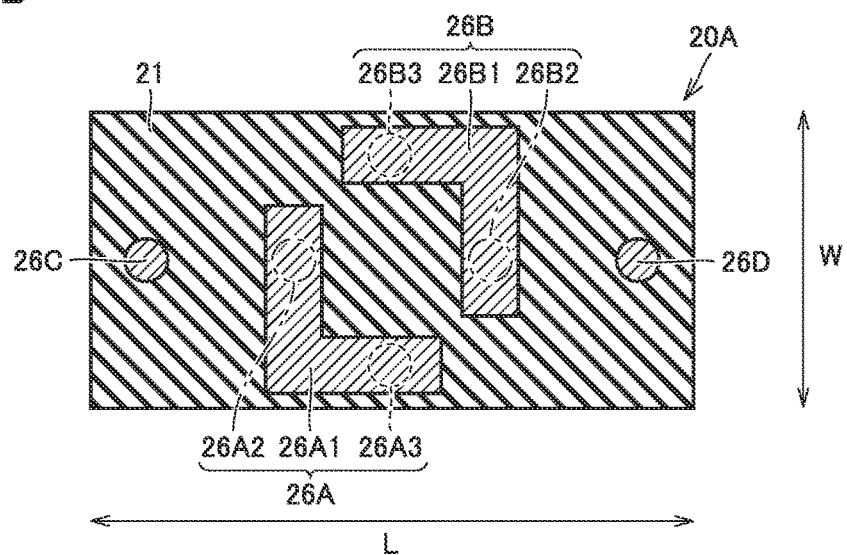
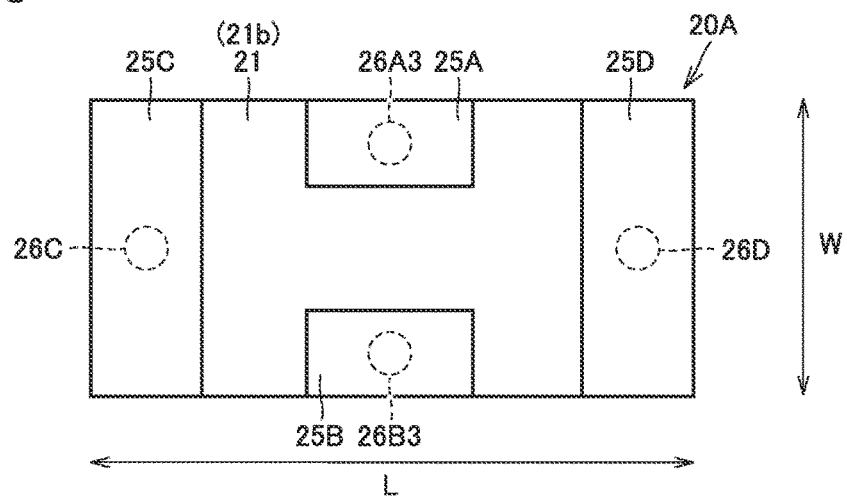

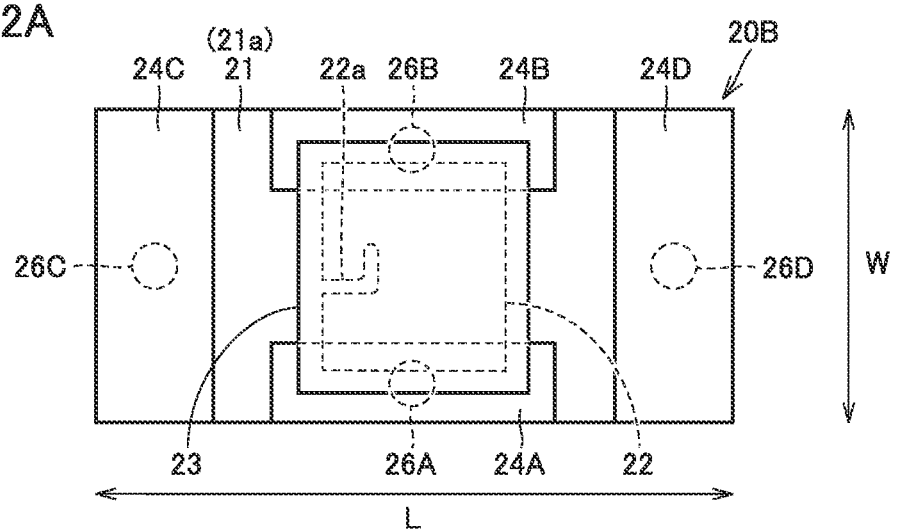
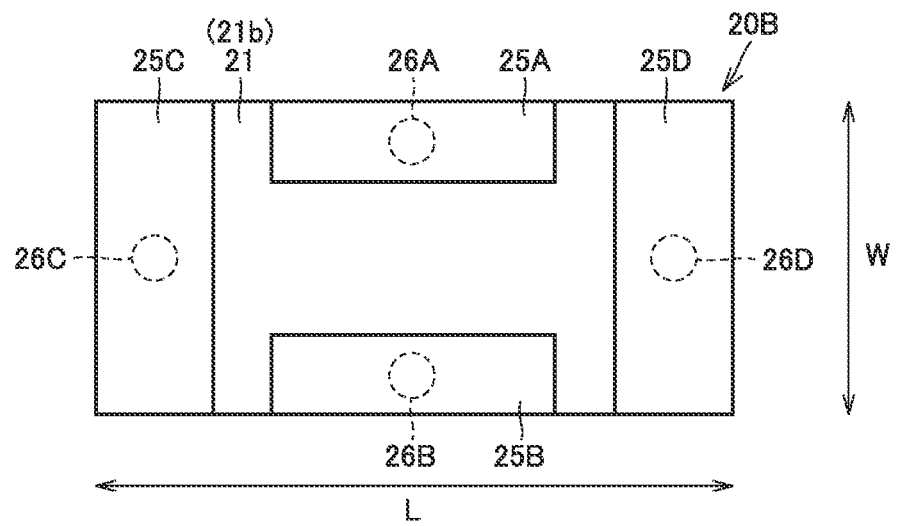

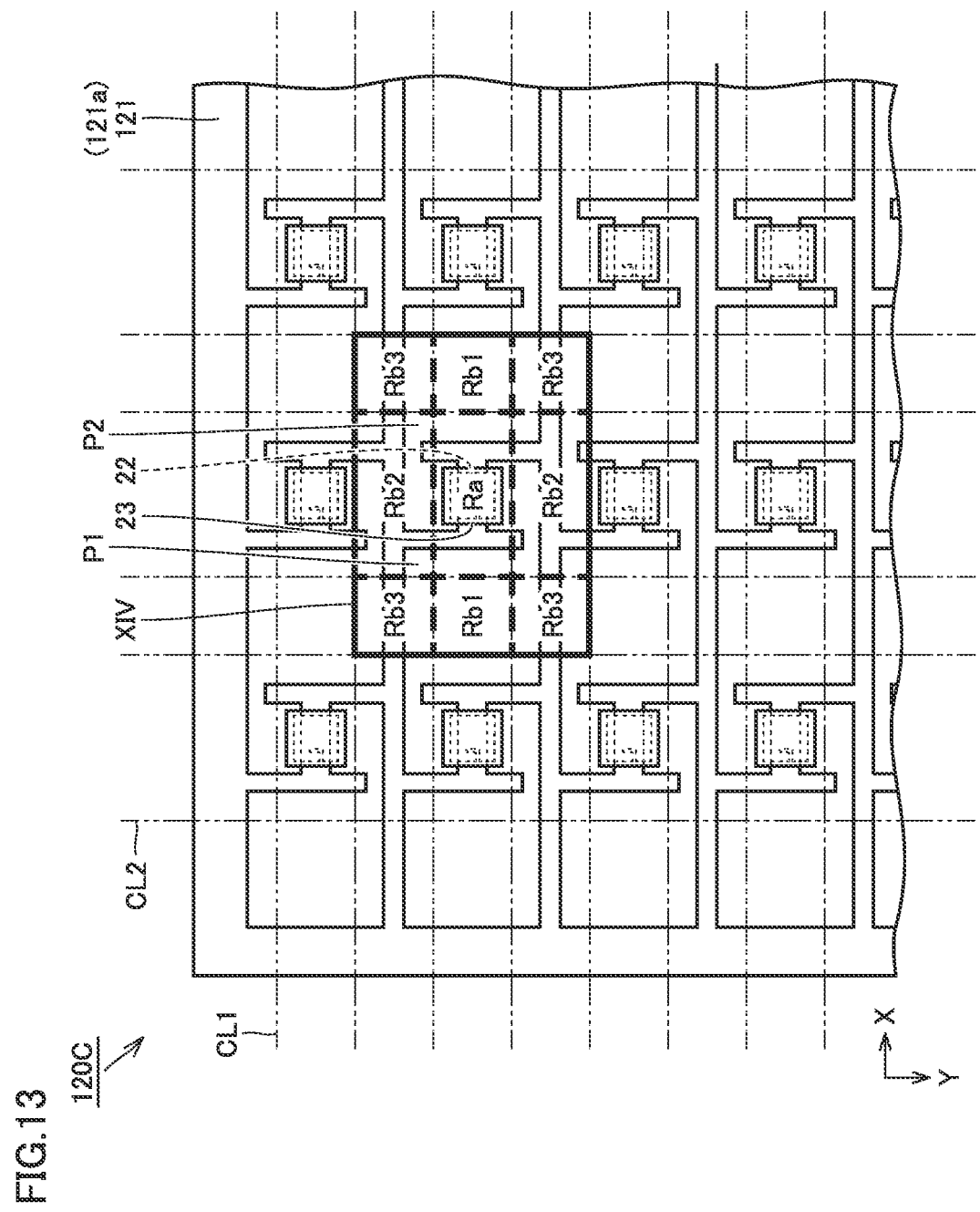

COLLECTIVE SUBSTRATE FOR RESISTOR DEVICES

CROSS REFERENCE TO RELATED APPLICATIONS

This application claims the benefit of priority to Japanese Patent Application 2015-166914 filed Aug. 26, 2015, the entire contents of this application are hereby incorporated herein by reference.

BACKGROUND OF THE INVENTION

1. Field of the Invention

The present invention relates to a collective substrate for resistor devices (hereinafter also referred to simply as a collective substrate). The collective substrate is a work in process in which a plurality of resistor devices to be included in composite electronic components are manufactured together.

2. Description of the Related Art

Inventions for a composite electronic component made up of a plurality of electronic devices have been proposed in terms of integration of electronic devices at a high density.

For example, Japanese Patent Laying-Open No. 6-283301 discloses a composite electronic component into which a plurality of electronic devices that are identical in shape and dimensions are integrated. These electronic devices are of two or more kinds selected from multiple kinds of electronic devices such as chip-type resistors, chip-type thermistors, chip-type capacitors, and chip-type varistors. In this composite electronic component, the electronic devices are laid on each other along the thickness direction, and a lead frame covers respective terminal electrodes of the electronic devices together. The electronic devices are thus integrated into the composite electronic component.

An invention relating to trimming which is performed when chip-type resistors are manufactured together is disclosed, for example, in Japanese Patent Laying-Open Nos. 11-340002 and 2005-303199.

In view of the fact that the decreasing size of the chip-type resistor makes it difficult to press a probe of a resistance meter against an electrode of the chip-type resistor, the inventions disclosed in Japanese Patent Laying-Open Nos. 11-340002 and 2005-303199 provide to-be-product regions and to-be-cut-away regions in a collective substrate for resistor devices, namely in a work in process. The to-be-product regions and the to-be-cut-away regions are arranged so that the to-be-product region and the to-be-cut-away region alternate with each other in a column or a row. In the to-be-product region, a resistive element is provided. In the to-be-cut-away region, an electrode portion connected to the resistive element is provided as an electrode to measure the resistance value.

The inventors of the present invention have proposed, in Japanese Patent Application No. 2015-049457 filed prior to the present application, a composite electronic component enabling a higher degree of freedom in circuit design as compared with the one disclosed in Japanese Patent Laying-Open No. 6-283301. The disclosed composite electronic component is a new composite electronic component that includes one substrate-type electronic device which has an electrically insulating base serving as a substrate and equipped with a resistive function and another electronic device joined to the substrate-type electronic component.

In this new composite electronic component, the upper surface of the insulating base of the substrate-type electronic device faces the other electronic device. On this upper surface, an upper surface conductor is provided, and the upper surface conductor and an external electrode of the other electronic device are connected to each other via a joint member. In a preferred embodiment of this composite electronic component having the new configuration, the upper surface of the insulating base of the substrate-type electronic device is further equipped with a functional unit in addition to the upper surface conductor. The functional unit includes a resistive element, another upper surface conductor connected to the resistive element, and a protective film protecting the resistive element.

In this case, between the other upper surface conductor connected to the resistive element and the electrode portion provided to measure the resistance value of the resistive element, the upper surface conductor on which the other electronic device is to be mounted is disposed. Accordingly, on the upper surface of the substrate-type electronic device, there are a plurality of upper surface conductors electrically insulated from each other and including the upper surface conductor which is not connected to the resistive element. In this case, if the substrate-type electronic device is of a considerably small size, the following problem arises. Namely, even when to-be-product regions and to-be-cut-away regions are provided so that the to-be-product region and the to-be-cut-away region alternate with each other in a column or a row as disclosed in Japanese Patent Laying-Open Nos. 11-340002 and 2005-303199, connection between the electrode portion and the upper surface conductor which is connected to the resistive element may be difficult to make, or even this connection can be made, the to-be-cut-away region may be increased, resulting in significant reduction of the yield, namely the number of resistor devices produced from one collective substrate.

Particularly in the case where the resistance value of the resistive element is small, it is necessary to use a four-terminal sensing probe in order to eliminate the influence of the contact resistance. In this case, however, it is necessary to make the electrode portion accordingly large, resulting in significant reduction of the yield.

SUMMARY OF THE INVENTION

Preferred embodiments of the present invention provide a collective substrate for resistor devices enabling a high yield while avoiding upsizing of a to-be-cut-away region.

A collective substrate for resistor devices according to a preferred embodiment of the present invention includes a base including a plurality of to-be-product regions arranged in rows and columns and separated from each other, and a to-be-cut-away region in a lattice shape located between the plurality of to-be-product regions; a plurality of resistive elements disposed on an upper surface of the base; and a plurality of first conductive patterns disposed on the upper surface of the base. Each of the plurality of resistive elements is disposed in a corresponding to-be-product region of the plurality of to-be-product regions. Each of the plurality of first conductive patterns is disposed in a corresponding unit region of a plurality of unit regions. The unit region is defined as a region including one to-be-product region of the plurality of to-be-product regions, and a frame region which is a portion of the to-be-cut-away region and surrounds the one to-be-product region. The frame region in each of the plurality of unit regions includes: a first region adjacent to the to-be-product region in a first direction; and a second region adjacent to the to-be-product region in a second direction. The first direction is one of a row direction and a column direction in which the plurality of to-be-product regions are arranged, and the second direction is the other of the row direction and the column direction. The first conductive pattern in each of the plurality of unit regions includes: a first terminal portion connected to the resistive element and disposed in the to-be-product region; a first electrode portion disposed at least in the first region and larger in area than the first terminal portion; and a first interconnect portion extended from the first terminal portion toward the second region and connected to the first electrode portion through only the frame region.

The collective substrate for resistor devices according to a preferred embodiment of the present invention may further include a plurality of second conductive patterns disposed on the upper surface of the base and separated from each of the plurality of first conductive patterns. In this case, each of the plurality of second conductive patterns is preferably disposed in a corresponding unit region of the plurality of unit regions. In this case, the second conductive pattern in each of the plurality of unit regions preferably includes: a second terminal portion connected to the resistive element and disposed in the to-be-product region; a second electrode portion disposed at least in the first region and larger in area than the second terminal portion; and a second interconnect portion extended from the second terminal portion toward the second region and connected to the second electrode portion through only the frame region.

According to a collective substrate for resistor devices of a preferred embodiment of the present invention, in each of the plurality of unit regions, the first terminal portion and the second terminal portion may be separated from each other in the first direction.

According to this preferred embodiment of the present invention, in each of the plurality of unit regions, the first electrode portion may include a first portion located in the to-be-product region and continuing from a portion of the first electrode portion located in the first region, and the second electrode portion may include a second portion located in the to-be-product region and continuing from a portion of the second electrode portion located in the first region. In this case, in each of the plurality of unit regions, the first portion may be separated from the first terminal portion in the first direction, and the second portion may be separated from the second terminal portion in the first direction.

According to a preferred embodiment of the present invention, a collective substrate for resistor devices may further include: a plurality of third conductive patterns disposed on the upper surface of the base, and separated from each of the plurality of first conductive patterns and from each of the plurality of second conductive patterns; and a plurality of fourth conductive patterns disposed on the upper surface of the base, and separated from each of the plurality of first conductive patterns and from each of the plurality of second conductive patterns. In this case, the plurality of third conducive patterns may each be disposed in a corresponding unit region of the plurality of unit regions, the plurality of fourth conductive patterns may each be disposed in a corresponding unit region of the plurality of unit regions. In this case, in each of the plurality of unit regions, the third conductive pattern may be disposed in a portion of the to-be-product region, the portion being located between the first terminal portion and the first electrode portion, and the fourth conductive pattern may be disposed in a portion of the to-be-product region, the portion being located between the second terminal portion and the second electrode portion.

Further, in this case, in each of the plurality of unit regions, preferably a distance in the first direction between the first terminal portion and the first electrode portion and a distance in the first direction between the second terminal portion and the second electrode portion are each smaller than a distance in the first direction between the first terminal portion and the second terminal portion.

According to a collective substrate for resistor devices of a preferred embodiment of the present invention, in each of the plurality of unit regions, the first terminal portion and the second terminal portion may be separated from each other in the second direction.

According to this preferred embodiment of the present invention, in each of the plurality of unit regions, the first electrode portion may include a first portion located in the to-be-product region and continuing from a portion of the first electrode portion located in the first region, and the second electrode portion may include a second portion located in the to-be-product region and continuing from a portion of the second electrode portion located in the first region. In this case, in each of the plurality of unit regions, the first portion may be separated from the first terminal portion in the first direction, and the second portion may be separated from the second terminal portion in the first direction.

According to a preferred embodiment of the present invention, a collective substrate for resistor devices may further include: a plurality of third conductive patterns disposed on the upper surface of the base, and separated from each of the plurality of first conductive patterns and from each of the plurality of second conductive patterns; and a plurality of fourth conductive patterns disposed on the upper surface of the base, and separated from each of the plurality of first conductive patterns and from each of the plurality of second conductive patterns. In this case, the plurality of third conducive patterns may each be disposed in a corresponding unit region of the plurality of unit regions, and the plurality of fourth conductive patterns may each be disposed in a corresponding unit region of the plurality of unit regions. In this case, in each of the plurality of unit regions, the third conductive pattern may be disposed in a portion of the to-be-product region, the portion being located between the first terminal portion and the first electrode portion, and the fourth conductive pattern may be disposed in a portion of the to-be-product region, the portion being located between the second terminal portion and the second electrode portion.

In a collective substrate for resistor devices according to a preferred embodiment of the present invention, preferably the first electrode portion connected to the first terminal portion of one to-be-product region of a pair of to-be-product regions which are adjacent to each other in the first direction, and the second electrode portion connected to the second terminal portion of the other to-be-product region of the pair of to-be-product regions are a single common electrode portion.

A collective substrate for resistor devices according to a preferred embodiment of the present invention may further include a plurality of protective films disposed on the upper surface of the base. In this case, preferably the plurality of protective films are each disposed in a corresponding to-be-product region of the plurality of to-be-product regions. In this case, in each of the plurality of unit regions, the protective film preferably covers the resistive element, at least a portion of the first terminal portion, and at least a portion of the second terminal portion.

In accordance with various preferred embodiments of the present invention, a collective substrate for resistor devices is able to be provided that enables a high yield while avoiding upsizing of the to-be-cut-away region.

The above and other elements, features, steps, characteristics and advantages of the present invention will become more apparent from the following detailed description of the preferred embodiments with reference to the attached drawings.

BRIEF DESCRIPTION OF THE DRAWINGS

FIGS. 3A, 3B, and 3C are a schematic top view, a schematic cross-sectional view, and a schematic bottom view, respectively, of the resistor device shown in FIG. 1.

FIGS. 12A and 12B are a schematic top view and a schematic bottom view, respectively, of the resistor device shown in FIG. 10.

FIG. 13 is a schematic top view of the collective substrate for resistor devices according to the third preferred embodiment of the present invention.

DETAILED DESCRIPTION OF THE PREFERRED EMBODIMENTS

Figure 1:
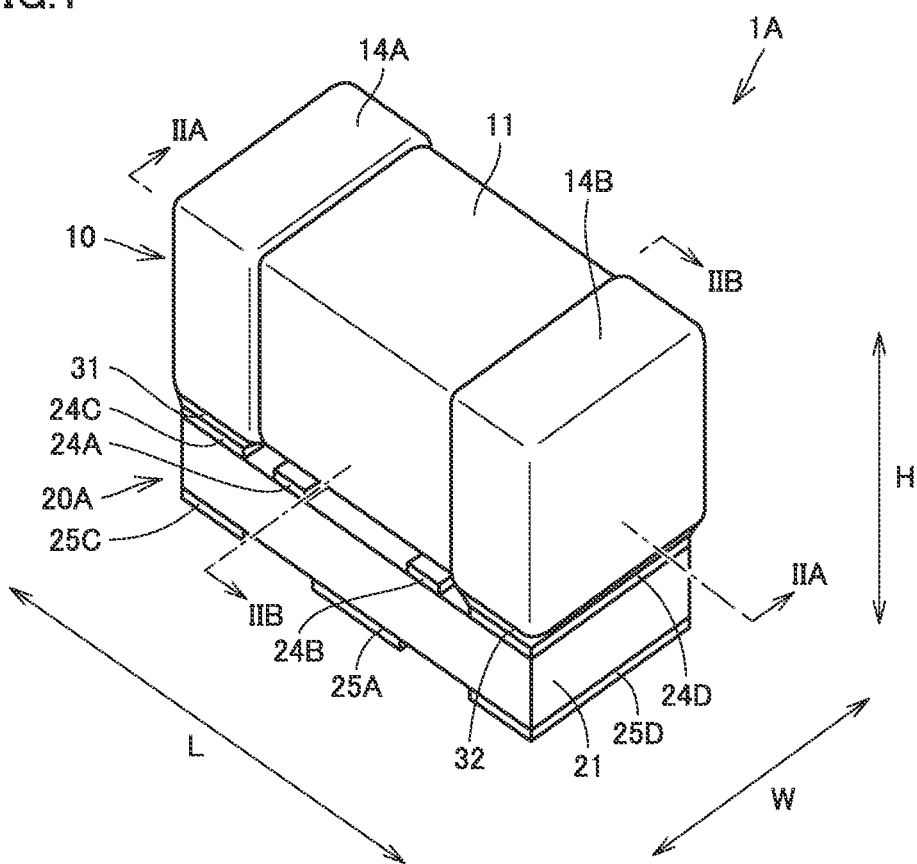
FIG. 1 is a schematic perspective view of a composite electronic component including a resistor device manufactured using a collective substrate for resistor devices according to a first preferred embodiment of the present invention.

In the following, preferred embodiments of the present invention will be described in detail with reference to the drawings. The same or common components in the following are denoted by the same reference characters herein and in the drawings, and a description thereof will not be repeated in principle.

First Preferred Embodiment

Figure 2A:
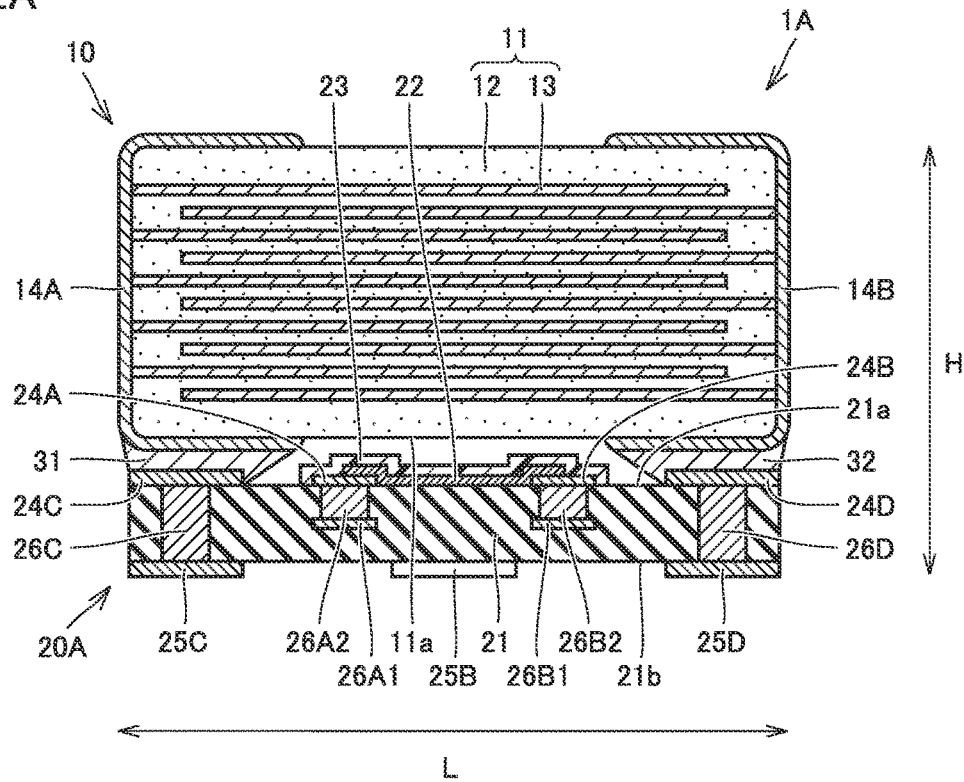
FIG. 2A and FIG. 2B are each a schematic cross-sectional view of the composite electronic component shown in FIG. 1.
Figure 2B:
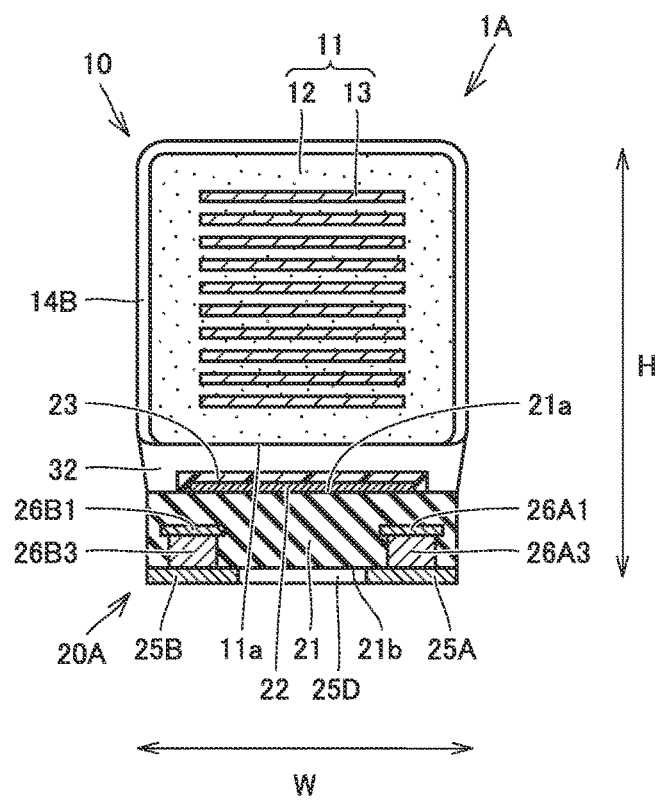
Figure 4:
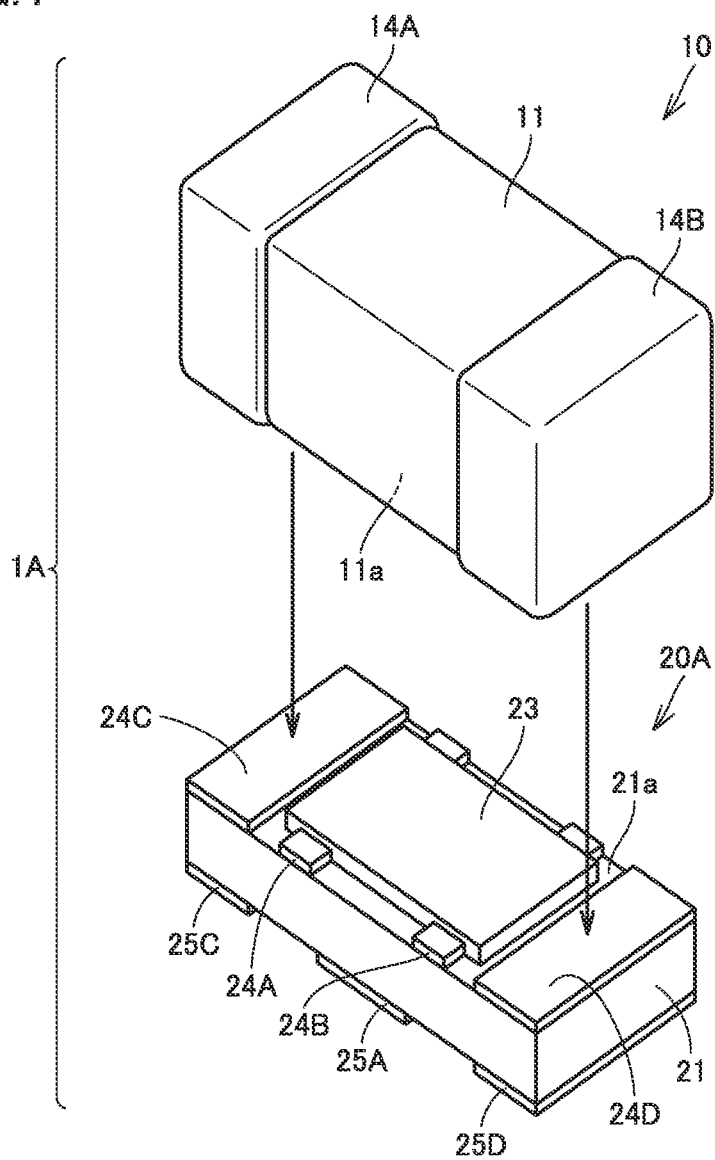
FIG. 4 is a schematic perspective exploded view of the composite electronic component shown in FIG. 1.

FIG. 1 is a schematic perspective view of a composite electronic component 1A including a resistor device 20A manufactured using a collective substrate 120A (see FIGS. 6 and 7) according to a first preferred embodiment of the present invention. FIGS. 2A and 2B are schematic cross-sectional views of composite electronic component 1A along a line IIA-IIA and a line IIB-IIB shown in FIG. 1, respectively. FIGS. 3A, 3B, and 3C are a schematic top view, a schematic cross-sectional view, and a schematic bottom view, respectively, of resistor device 20A shown in FIG. 1. FIG. 4 is a schematic perspective exploded view of composite electronic component 1A shown in FIG. 1.

Before providing a description of collective substrate 120A in the present preferred embodiment, a description will be given of resistor device 20A manufactured using collective substrate 120A, and of composite electronic component 1A including this resistor device 20A, with reference to FIGS. 1 to 4. It should be noted that composite electronic component 1A described below is merely illustrated as an exemplary use of resistor device 20A manufactured using collective substrate 120A in the present preferred embodiment, and naturally other uses of resistor device 20A are possible.

As shown in FIGS. 1 to 2B and FIG. 4, composite electronic component 1A includes two electronic devices. Namely, composite electronic component 1A includes a capacitor device 10 as a first electronic device and a resistor device 20A as a second electronic device.

As shown mainly in FIG. 1 and FIG. 4, the capacitor device 10 has a substantially rectangular parallelepiped shape, and the dimension of the four sides along a length direction L is larger than the dimension of the four sides along a width direction W. The substantially rectangular parallelepiped shape herein includes a rectangular parallelepiped shape having its vertices and edges partially or wholly rounded for example, or having its face, namely a portion or all of its six surfaces, stepped or roughened, for example.

As also shown mainly in FIGS. 1 and 4, resistor device 20A has a substantially flat plate shape with a predetermined thickness, and the dimension of the four sides along length direction L is larger than the dimension of the four sides along width direction W. The substantially flat plate shape herein includes a flat plate shape having its vertices and edges partially or wholly rounded, for example, or having its face, namely a portion or all of the six surfaces of resistor device 20A, stepped or roughened, for example.

As shown in FIGS. 1 to 2B and FIG. 4, capacitor device 10 is arranged on resistor device 20A. In this arrangement, a lower surface 11a of capacitor device 10 faces an upper surface 21a of resistor device 20A. As shown in FIGS. 1 to 2B, capacitor device 10 is joined to resistor device 20A via a first joint member 31 and a second joint member 32.

In the following, for the sake of specifically explaining a configuration of composite electronic component 1A, the direction in which capacitor device 10 and resistor device 20A are arranged is referred to as height direction H. Among directions perpendicular or substantially perpendicular to height direction H, the direction in which a first external electrode 14A and a second external electrode 14B of capacitor device 10 are arranged is referred to as length direction L, and a direction perpendicular or substantially perpendicular to both height direction H and length direction L is referred to as width direction W. First external electrode 14A and second external electrode 14B will be detailed later herein.

As shown in FIGS. 1 to 2B and FIG. 4, capacitor device 10 is a multilayer ceramic capacitor, for example, and includes a capacitor body 11 as well as first external electrode 14A and second external electrode 14B provided on the surface of capacitor body 11. Capacitor body 11 has a substantially rectangular parallelepiped shape, and first external electrode 14A and second external electrode 14B which are each located in a predetermined region of the surface of the capacitor body are separated from each other in length direction L.

As shown in FIGS. 2A and 2B, capacitor body 11 includes a plurality of dielectric layers 12 and a plurality of internal electrode layers 13, and these layers are stacked so that each single layer of a plurality of dielectric layers 12 alternates with a single layer of a plurality of internal electrode layers 13. In the composite electronic component 10A, the direction in which a plurality of dielectric layers 12 and a plurality of internal electrode layers 13 are stacked is generally identical to height direction H. It should be noted that this is merely given by way of example and the direction in which a plurality of dielectric layers 12 and a plurality of internal electrode layers 13 are stacked may be generally identical to width direction W.

A plurality of dielectric layers 12 include a material including, for example, a ceramic material containing, as a main component, barium titanate ($BaTiO_3$), calcium titanate ($CaTiO_3$), strontium titanate ($SrTiO_3$), or calcium zirconium ($CaZrO_3$), or the like. A plurality of dielectric layers 12 may further include, as an accessory component at a lower content than the content of the main component, Mn, Mg, Si, Co, Ni, or rare earth, or the like. In contrast, a plurality of internal electrode layers 13 include a material including, for example, a metal material such as Ni, Cu, Ag, Pd, Ag—Pd alloy, or Au, or the like.

Each of first external electrode 14A and second external electrode 14B includes a plurality of conductive layers including a base conductive layer and a covering conductive layer. The base conductive layer refers to an electrically conductive layer directly disposed on a portion of the surface of capacitor body 11, and the covering conductive layer refers to an electrically conductive layer covering the base electrode layer. The base conductive layer is, for example, a sintered metal layer. The sintered metal layer refers to a layer formed by baking a paste containing glass and Cu, Ni, Ag, Pd, Ag—Pd alloy, or Au, or the like. The covering conductive layer is, for example, a plating layer. The plating layer refers to a layer formed by plating. The covering conductive layer is a plating layer containing Ni and a plating layer containing Sn, for example. Alternatively, the covering conductive layer may be a plating layer containing Cu and a plating layer containing Au.

First external electronic 14A and second external electrode 14B may each be only a plating layer without the base conductive layer. The base conductive layer may be an electrically conductive resin layer formed by hardening an electrically conductive resin paste containing a metal component and a resin component.

As shown in FIGS. 1 to 2B, capacitor body 11 includes a pair of end surfaces opposite to each other in length direction L, a pair of side surfaces opposite to each other in width direction W, and a pair of main surfaces opposite to each other in height direction H. Among these surfaces, lower surface 11a, which is one of the pair of main surfaces opposite to each other in height direction H, faces resistor device 20A.

First external electrode 14A is disposed to abut on one end surface of capacitor body 11 and respective portions of the pair of side surfaces and the pair of main surfaces of capacitor body 11. Second external electrode 14B is disposed to abut on the other end surface of capacitor body 11 and respective portions of the pair of side surfaces and the pair of main surfaces of capacitor body 11. Accordingly, lower surface 11a of capacitor body 11 is able to be identified as including a region where first external electrode 14A is disposed, a region where second external electrode 14B is disposed, and a region where the external electrodes are not disposed and a portion of capacitor body 11 is exposed.

As shown in FIGS. 2A and 2B, two internal electrode layers 13 of a plurality of internal electrode layers 13 are adjacent to each other along height direction H, with one of a plurality of dielectric layers 12 interposed therebetween. One of the two internal electrode layers 13 is a first internal electrode layer extended to one end surface of capacitor body 11 to be connected to first external electrode 14A. The other of the two internal electrode layers 13 is a second internal electrode layer extended to the other end surface of capacitor body 11 to be connected to second external electrode 14B. Thus, first external electrode 14A and second external electrode 14B implement a condition where a plurality of capacitors are electrically connected in parallel.

The capacitor device 10 may be manufactured, for example, through the following procedure. First, a raw sheet is prepared by printing an electrically conductive paste which is to form internal electrode layer 13, on a surface of a ceramic green sheet which is to form dielectric layer 12. A plurality of raw sheets thus prepared are alternately stacked and joined together by pressure to produce a multilayer chip. Here, a multilayer block into which a plurality of multilayer chips are integrated may be produced first, thereafter the multilayer block may be separated into the multilayer chips, and accordingly multilayer chips are produced. Then, the multiplayer chip is fired to produce capacitor body 11. First external electrode 14A and second external electrode 14B are thereafter formed on the surface of capacitor body 11, and accordingly above-described capacitor device 10 is produced.

It should be noted that the size of capacitor device 10 is not particularly limited. By way of example, capacitor device 10 may have a dimension of about 0.60 mm in length direction L, a dimension of about 0.30 mm in width direction W, and a dimension of about 0.30 mm in height direction H.

As shown in FIGS. 1 to 4, resistor device 20A includes an electrically insulating base 21, a resistive element 22, a protective film 23, a first upper surface conductor 24A, a second upper surface conductor 24B, a third upper surface conductor 24C, and a fourth upper surface conductor 24D (they may be referred to collectively as "first upper surface conductors 24A to fourth upper surface conductors 24D" hereinafter), a first lower surface conductor 25A, a second lower surface conductor 25B, a third lower surface conductor 25C, and a fourth lower surface conductor 25D (they may be referred to collectively as "first lower surface conductor 25A to fourth lower surface conductor 25D" hereinafter), a first connection conductor 26A, a second connection conductor 26B, a third connection conductor 26C, and a fourth connection conductor 26D (they may be referred to collectively as "first connection conductor 26A to fourth connection conductor 26D" hereinafter).

As shown mainly in FIGS. 2A and 2B, base 21 has a substantially flat plate shape with a predetermined thickness, and is made of a resin material such as epoxy resin, a ceramic material such as alumina, or is made of a resin material or a ceramic material to which filler, woven fabric, or the like of an inorganic material or an organic material is added, for example. More preferably, an alumina substrate or a ceramic substrate including low temperature co-fired ceramic (LTCC) substrate is used as base 21. In resistor device 20A, base 21 is an LTCC substrate into which two ceramic green sheets are stacked and integrated.

Base 21 includes a first side surface and a second side surface which are a pair of side surfaces opposite to each other in length direction L, a third side surface and a fourth side surface which are a pair of side surfaces opposite to each other in width direction W, and a pair of main surfaces opposite to each other in height direction H. As shown in FIGS. 2A, 2B, and 4, upper surface 21a which is one of the pair of main surfaces that faces lower surface 11a of capacitor device 10, and lower surface 21b which is the other of the pair of main surfaces that faces a circuit board which is not shown in the drawings.

As shown in FIGS. 2A to 3C, resistive element 22 is disposed at a predetermined position on upper surface 21a of base 21. When resistor device 20A is seen in plan view along height direction H, resistive element 22 has a rectangular or circular film shape. As resistive element 22, any of a variety of materials may be used depending on use. For example, a metal film, a metal oxide film, or a metal glaze film which is a mixture of a metal oxide film and glass, or the like may be used as resistive element 22. In terms of temperature characteristics or the like, resistive element 22 is preferably made of a metal material.

It should be noted that resistive element 22 may include a thick film which is formed by a so-called thick-film formation process in which a paste is applied and the applied paste is baked, or may include a thin film which is formed by a so-called thin-film formation process such as sputtering, metal vapor deposition, or the like. In the case where resistive element 22 includes a thick film, the thickness thereof is, for example, not less than about 5 μm and not more than about 30 μm. In the case where resistive element 22 includes a thin film, the thickness thereof is, for example, not less than about 10 nm and not more than about 30 nm.

As shown in FIGS. 2A to 3C, protective film 23 covers resistive element 22 on upper surface 21a of base 21, and includes, for example, an electrically insulating film of an inorganic material such as glass or $SiO_2$ or the like, a resin material such as epoxy resin or polyimide resin, or the like, or a composite film of these materials, for example. Protective film 23 has a thickness, for example, of not less than about 5 μm and not more than about 30 μm. Protective film 23 preferably covers the whole of resistive element 22 so as not to expose resistive element 22.

As shown in FIGS. 2A to 4, particularly in FIG. 3A, first upper surface conductor 24A to fourth upper surface conductor 24D are all disposed on upper surface 21a of base 21. First upper surface conductor 24A to fourth upper surface conductor 24D preferably have a rectangular or substantially rectangular shape having its dimension in length direction L smaller than its dimension in width direction W when resistor device 20A is seen in plan view along height direction H.

First upper surface conductor 24A and second upper surface conductor 24B are separated from each other in length direction L with the center of base 21 located therebetween. First upper surface conductor 24A is disposed between the center of base 21 and the first side surface in length direction L. Second upper surface conductor 24B is disposed between the center of base 21 and the second side surface in length direction L. Third upper surface conductor 24C is disposed on an end at a side of the first side surface, along length direction L of base 21. Fourth upper surface conductor 24D is disposed on the end at a side of the second side surface, along length direction L of base 21. Preferably, first upper surface conductor 24A and second upper surface conductor 24B are located between third upper surface conductor 24C and fourth upper surface conductor 24D in length direction L.

The two opposite ends, in width direction W, of each of first upper surface conductor 24A to fourth upper surface conductor 24D extend to reach corresponding opposite ends, along width direction W, of base 21. Namely, first upper surface conductor 24A to fourth upper surface conductor 24D are identical to each other in dimension in width direction W.

First upper surface conductor 24A and second upper surface conductor 24B each have a dimension of about 0.06 mm in length direction L, for example, and third upper surface conductor 24C and fourth upper surface conductor 24D each have a dimension of about 0.1 mm in length direction L for example. Each of the distance, in length direction L, between first upper surface conductor 24A and third upper surface conductor 24C, and the distance, in length direction L, between second upper surface conductor 24B and fourth upper surface conductor 24D is about 0.07 mm, for example. The distance, in length direction L, between first upper surface conductor 24A and second upper surface conductor 24B is about 0.14 mm, for example.

Preferably, the dimension, in length direction L, of third upper surface conductor 24C and fourth upper surface conductor 24D is larger than the dimension, in length direction L, of first upper surface conductor 24A and second upper surface conductor 24B. In this case, the strength of joint between capacitor device 10 and resistor device 20A is able to be increased and the degree of freedom in adjusting electrical characteristics of resistive element 22 is able to be enhanced because of the increase of the area of resistive element 22.

Preferably, the distance, in length direction L, between first upper surface conductor 24A and third upper surface conductor 24C and the distance, in length direction L, between second upper surface conductor 24B and fourth upper surface conductor 24D are each smaller than the distance, in length direction L, between first upper surface conductor 24A and second upper surface conductor 24B. In this case, the strength of joint between capacitor device 10 and resistor device 20A is able to be increased and the degree of freedom in adjusting electrical characteristics of resistive element 22 is able to be enhanced because of the increase of the area of resistive element 22.

As shown in FIGS. 2A to 4, particularly in FIG. 3C, first lower surface conductor 25A to fourth lower surface conductor 25D are all disposed on lower surface 21b of base 21. First lower surface conductor 25A and second lower surface conductor 25B each preferably have a rectangular or substantially rectangular shape having the dimension in length direction L larger than the dimension in width direction W when resistor device 20A is seen in plan view along height direction H. Third lower surface conductor 25C and fourth lower surface conductor 25D each preferably have a rectangular or substantially rectangular shape having the dimension in length direction L smaller than the dimension in width direction W when resistor device 20A is seen in plan view along height direction H.

First lower surface conductor 25A and second lower surface conductor 25B are separated from each other in width direction W with the center of base 21 located therebetween. First lower surface conductor 25A is disposed on an end at a side of the third side surface, along width direction W of base 21, and second lower surface conductor 25B is disposed on an end at a side of the fourth side surface, along width direction W of base 21. Third lower surface conductor 25C is disposed on an end at a side of the first side surface, along length direction L of base 21, and fourth lower surface conductor 25D is disposed on an end at a side of the second side surface, along length direction L of base 21. Preferably, first lower surface conductor 25A and second lower surface conductor 25B are located between third lower surface conductor 25C and fourth lower surface conductor 25D in length direction L. Third lower surface conductor 25C is opposite to third upper surface conductor 24C with base 21 interposed therebetween, and fourth lower surface conductor 25D is opposite to fourth upper surface conductor 24D with base 21 interposed therebetween.

As shown in FIGS. 2A to 3B, particularly in FIG. 3B, first connection conductor 26A to fourth connection conductor 26D are disposed in base 21.

First connection conductor 26A includes an internal connection conductor 26A1 as an embedded interconnect layer, and a pair of upper via conductor 26A2 and a lower via conductor 26A3 extending through base 21 in height direction H. Upper via conductor 26A2 and lower via conductor 26A3 have a substantially circular shape as seen in plan view along height direction H. First connection conductor 26A connects first upper surface conductor 24A and first lower surface conductor 25A to each other.

Second connection conductor 26B includes an internal connection conductor 26B1 as an embedded interconnect layer, and a pair of upper via conductor 26B2 and a lower via conductor 26B3 extending through base 21 in height direction H. Upper via conductor 26B2 and lower via conductor 26B3 have a substantially circular shape as seen in plan view along height direction H. Second connection conductor 26B connects second upper surface conductor 24B and second lower surface conductor 25B to each other.

Third connection conductor 26C is a via conductor extending through base 21 along height direction H, and has a substantially circular shape as seen in plan view along height direction H. Third connection conductor 26C overlaps third upper surface conductor 24C and third lower surface conductor 25C as seen in plan view along height direction H, and connects third upper surface conductor 24C and third lower surface conductor 25C to each other.

Fourth connection conductor 26D is a via conductor extending through base 21 along height direction H, and has a substantially circular shape as seen in plan view along height direction H. Fourth connection conductor 26D overlaps fourth upper surface conductor 24D and fourth lower surface conductor 25D as seen in plan view along height direction H, and connects fourth upper surface conductor 24D and fourth lower surface conductor 25D to each other.

In the case where first upper surface conductor 24A and second upper surface conductor 24B are separated from each other by a longer distance in length direction L, the region where first upper surface conductor 24A and first lower surface conductor 25A overlap each other is smaller and the region where second upper surface conductor 24B and second lower surface conductor 25B overlap each other is smaller, as seen in plan view in height direction H.

Even in such a case, because first connection conductor 26A includes internal connection conductor 26A1 extending in base 21 in the direction perpendicular or substantially perpendicular to height direction H and upper via conductor 26A2 and lower via conductor 26A3 which extend in base 21 in height direction H, first upper surface conductor 24A is able to be connected to first lower surface conductor 25A. Because second connection conductor 26B includes internal connection conductor 26B1 extending in base 21 in the direction perpendicular or substantially perpendicular to height direction H and upper via conductor 26B2 and lower via conductor 26B3 which extend in base 21 in height direction H, second upper surface conductor 24B is able to be connected to second lower surface conductor 25B.

More specifically, as seen in plan view along height direction H, internal connection conductor 26A1 has an L shape extending in length direction L and width direction W in base 21. Upper via conductor 26A2 is connected to internal connection conductor 26A1 and extends from internal connection conductor 26A1 toward upper surface 21a of base 21. Lower via conductor 26A3 is connected to internal connection conductor 26A1 and extends from internal connection conductor 26A1 toward lower surface 21b of base 21. As seen in plan view in height direction H, upper via conductor 26A2 and lower via conductor 26A3 do not overlap each other at least partially.

With this configuration, even in the case where the overlapping region of first upper surface conductor 24A and first lower surface conductor 25A is small as seen in plan view, these first upper surface conductor 24A and first lower surface conductor 25A are able to be connected through internal connection conductor 26A1, upper via conductor 26A2, and lower via conductor 26A3.

As seen in plan view along height direction H, internal connection conductor 26B1 has an L shape extending in length direction L and width direction W in base 21. Upper via conductor 26B2 is connected to internal connection conductor 26B1 and extends from internal connection conductor 26B1 toward upper surface 21a of base 21. Lower via conductor 26B3 is connected to internal connection conductor 26B1 and extends from internal connection conductor 26B1 toward lower surface 21b of base 21. As seen in plan view in height direction H, upper via conductor 26B2 and lower via conductor 26B3 do not overlap each other at least partially.

With this configuration, even in the case where the overlapping region of second upper surface conductor 24B and second lower surface conductor 25B is small as seen in plan view, these second upper surface conductor 24B and second lower surface conductor 25B are able to be connected through internal connection conductor 26B1, upper via conductor 26B2, and lower via conductor 26B3.

Therefore, the above-described structure easily makes the arrangement of first upper surface conductor 24A and second upper surface conductor 24B different from the arrangement of first lower surface conductor 25A and second lower surface conductor 25B as seen in plan view in height direction H. It should be noted that preferably the via conductor reaching the upper surface or the lower surface of the base and exposed on the external surface of the resistor device completely overlaps the upper surface conductor or the lower surface conductor, for the sake of mounting stability and for the sake of preventing occurrence of short circuit, as long as this is possible in terms of design.

In the case where the upper via conductor and the lower via conductor overlap each other as seen in plan view in height direction H, the upper via conductor and the lower via conductor may be connected directly without providing the internal connection conductor.

First upper surface conductor 24A and second upper surface conductor 24B each include a portion which is covered with protective film 23 and a portion which is not covered with protective film 23. Third upper surface conductor 24C and fourth upper surface conductor 24D entirely fail to be covered with protective film 23.

The portion which is a portion of each upper surface conductor and which is not covered with protective film 23 includes a plurality of electrically conductive layers including, for example, a base conductive layer and two covering conductive layers. The base conductive layer is, for example, a sintered metal layer. Specifically, the base conductive layer is preferably a sintered metal layer containing Cu formed by baking a paste containing Cu and glass. Alternatively, the base conductive layer may be a thin film formed through a thin-film formation process such as sputtering, metal vapor deposition, or the like. Preferably, the two covering conductive layers are a plating layer containing Ni and a plating layer covering the Ni plating layer and containing Au, which are formed through a plating process, for example.

In contrast, the portion which is a portion of each upper surface conductor and which is covered with protective film 23 does not include the two covering conductive layers and includes the base conductive layer only, for example. This is implemented by covering a portion of each upper surface conductor with protective film 23, after the base conductive layer is formed and before the covering conductive layers are formed.

It should be noted that first lower surface conductor 25A to fourth lower surface conductor 25D each include a plurality of electrically conductive layers including, for example, a base conductive layer and two covering conductive layers.

The sintered metal layer containing Cu is a thick film which is formed by a so-called thick-film formation process in which a paste containing Cu and glass is baked, and which has a thickness of not less than about 10 µm and not more than about 30 µm, for example. As the base conductive layer, a sintered metal layer containing Ag or the like may be used other than the sintered metal layer containing Cu. In the case where the base conductive layer includes a thin film, the base conductive layer is preferably formed of a thin film containing Cu or Ag, and having a thickness of not less than about 10 nm and not more than about 30 nm, for example.

In contrast, the plating layer containing Ni and the plating layer containing Au each have a total thickness, for example, of not less than about 3 µm and not more than about 30 µm. The material for the covering conductive layer may be selected appropriately depending on the joint member, and is selected for example from Cu, Ag, Au, Ni, Sn, and the like.

Resistive element 22 is mainly located, in length direction L, between a region in which first upper surface conductor 24A is disposed and a region in which second upper surface conductor 24B is disposed. As seen in plan view in height direction H, one end of resistive element 22 in length direction L overlaps a portion of first upper surface conductor 24A, and the other end of resistive element 22 in length direction L overlaps a portion of second upper surface conductor 24B. Thus, first upper surface conductor 24A and second upper surface conductor 24B are connected to resistive element 22.

While the size of resistor device 20A in the present preferred embodiment is not particularly limited, resistor device 20A preferably may have, by way of example, a dimension of about 0.60 mm in length direction L, a dimension of about 0.30 mm in width direction W, and a dimension of about 0.14 mm in height direction H, for example.

Resistor device 20A may not include second upper surface conductor 24B and may include only three upper surface conductors, namely first upper surface conductor 24A, third upper surface conductor 24C, and fourth upper surface conductor 24D on the upper surface of base 21. In this case, resistive element 22 is connected to third upper surface conductor 24C or fourth upper surface conductor 24D, instead of second upper surface conductor 24B. In this case, resistor device 20A may not include second lower surface conductor 25B and second connection conductor 26B.

Resistor device 20A as a substrate-type electronic device included in composite electronic component 1A as described above is manufactured by producing collective substrate 120A (see FIGS. 6 and 7) into which a plurality of resistor devices 20A are integrated, and dividing the collective substrate into separate resistor devices. In the following, a non-limiting example of a process of manufacturing the resistor device will be described and then collective substrate 120A for resistor devices in the present preferred embodiment will be detailed.

Figure 5:
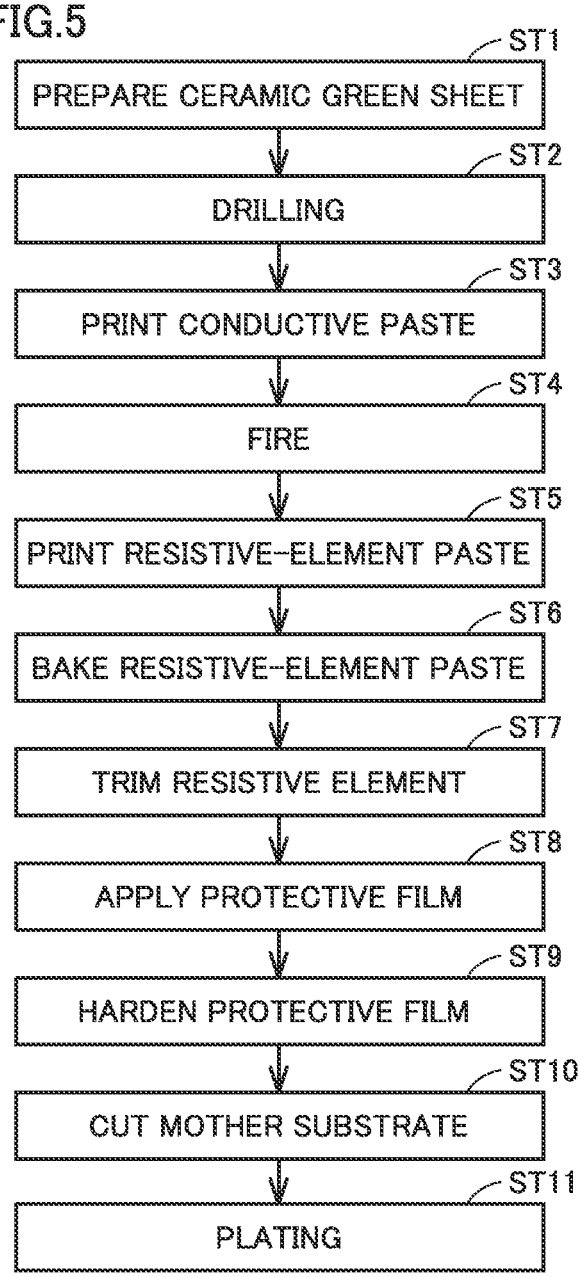
FIG. 5 is a diagram showing a production flow for the resistor device shown in FIG. 1.
Figure 6:
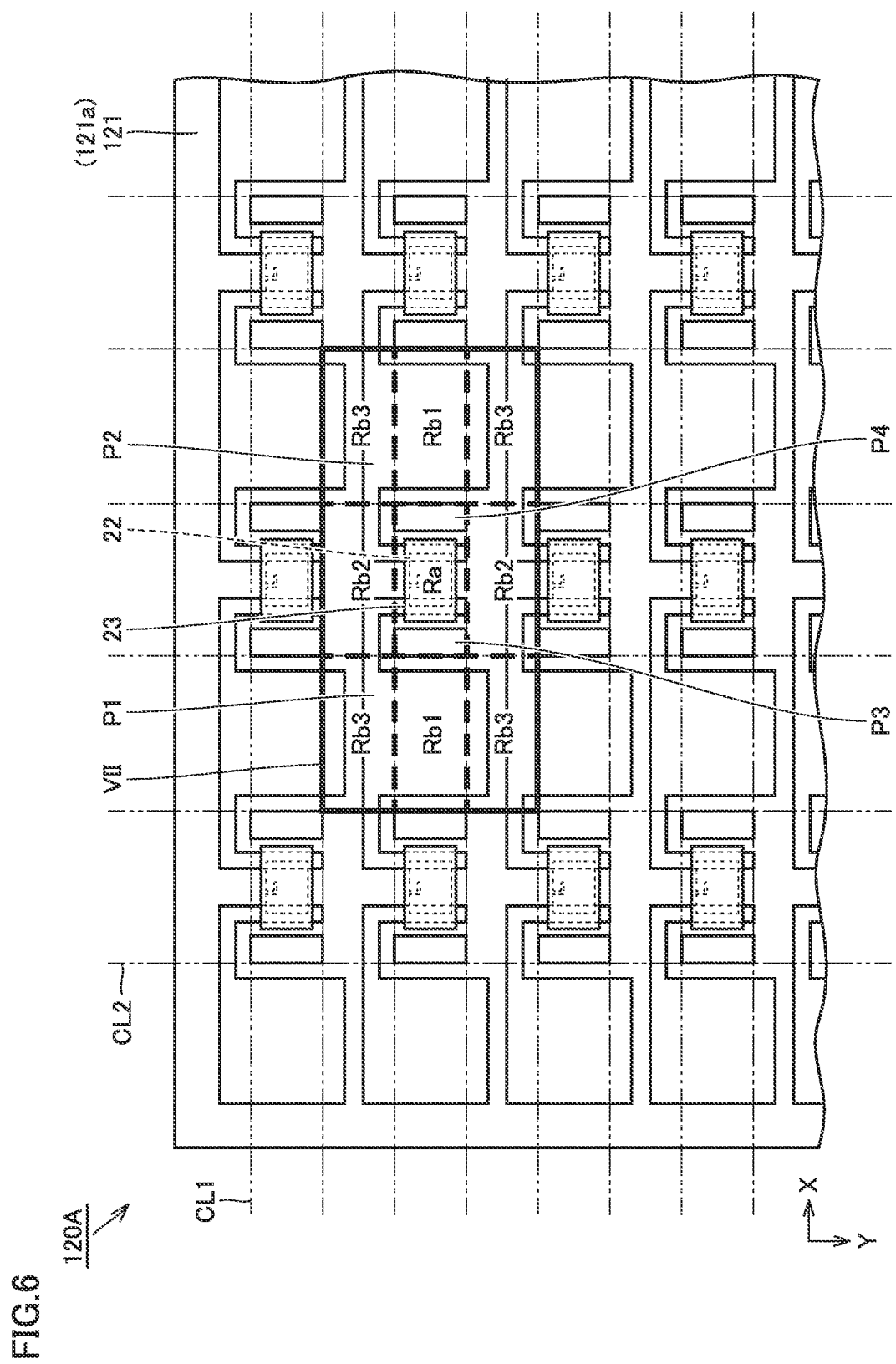
FIG. 6 is a schematic top view of the collective substrate for resistor devices according to the first preferred embodiment of the present invention.
Figure 7:
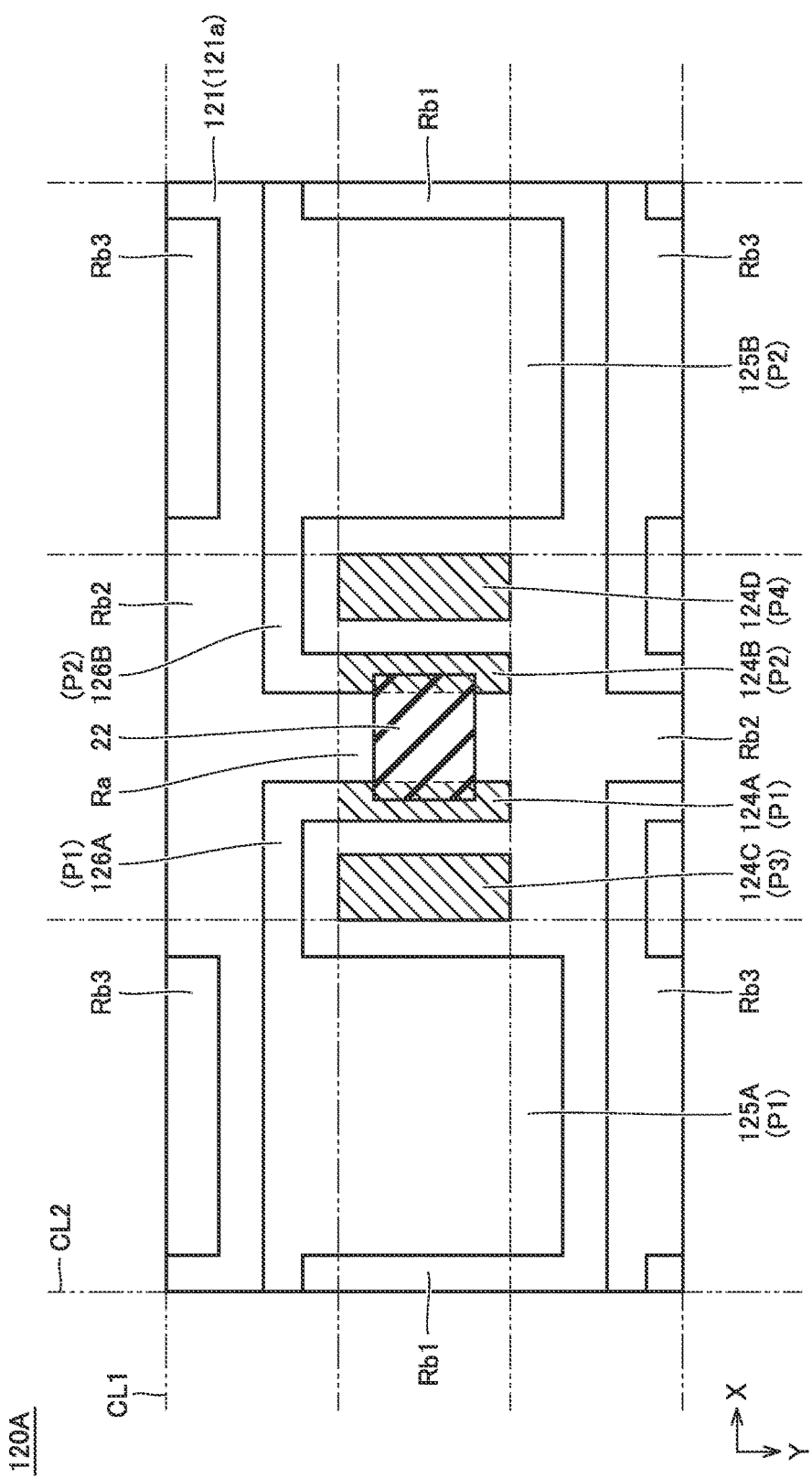
FIG. 7 is a schematic top view of the collective substrate for resistor devices shown in FIG. 6, showing a main portion of the substrate in an enlarged form.

FIG. 5 is a diagram showing a production flow for resistor device 20A shown in FIG. 1. FIG. 6 is a schematic top view of collective substrate 120A according to the present preferred embodiment, and FIG. 7 is a schematic top view showing, in an enlarged form, a unit region VII shown in FIG. 6.

As shown in FIG. 5, a ceramic green sheet is produced first (step ST1). Specifically, ceramic powder, a binder resin, and a solvent, for example, are mixed at a predetermined ratio to prepare a ceramic slurry. The ceramic slurry is applied, in the shape of a sheet, onto a carrier film through die coating, gravure coating, microgravure coating, screen printing, or spray coating, or the like, to form the ceramic green sheet. The formed ceramic green sheet is to define and function as a mother substrate 121 (see FIGS. 6 and 7) which is a collective body of resistor devices 20A, and also define and function as base 21 of resistor device 20A.

Next, drilling is performed (step ST2). Specifically, two ceramic green sheets are prepared, and a plurality of through holes are formed at respective predetermined positions in each ceramic green sheet. Formation of the through holes corresponds to a preprocess for forming upper via conductors 26A2 and 26B2 and lower via conductors 26A3 and 26B3.

Next, an electrically conductive paste is printed (step ST3). Specifically, on the upper surface of one of the two ceramic green sheets and the lower surface of the other ceramic green sheet, a Cu paste as the conductive paste is printed through screen printing or gravure printing, or the like. Thus, on the upper surface of one of the two ceramic sheets, an electrically conductive pattern in a predetermined shape made of the Cu paste is formed. This conductive pattern includes a portion which is to define and function as the base conductive layer of first upper surface conductor 24A to fourth upper surface conductor 24D. Further, on the lower surface of the other ceramic green sheet, an electrically conductive pattern in a predetermined shape made of the Cu paste is formed. This conductive pattern includes a portion which is to define and function as the base conductive layer of first lower surface conductor 25A to fourth lower surface conductor 25D.

At this time, the plurality of through holes formed in the two ceramic green sheets are filled with the Cu paste which is to define and function as upper via conductors 26A2 and 26B2 and lower via conductors 26A3 and 26B3. Further, on the lower surface of one of the two ceramic green sheets or the upper surface of the other ceramic green sheet, an electrically conductive pattern in a predetermined shape made of the Cu paste is also printed. This conductive pattern is to define and function as internal connection conductors 26A1 and 26B1.

Next, lamination and firing are performed (step ST4). Specifically, the above-described two ceramic green sheets are laminated, and the two laminated ceramic green sheets are heated to a predetermined temperature. Thus, the two ceramic green sheets as well as the electrically conductive patterns made of the Cu paste and printed on these two ceramic green sheets are sintered. Consequently, the two ceramic green sheets are united and changed into hard mother substrate 121, and the conductive patterns are changed into sintered metal layers. Accordingly, on and in mother substrate 121, the base conductive layers which are to define and function as a portion of first upper surface conductor 24A to fourth upper surface conductor 24D and first lower surface conductor 25A to fourth lower surface conductor 25D, as well as first connection conductor 26A to fourth connection conductor 26D are formed.

Next, a resistive-element paste is printed (step ST5). Specifically, on an upper surface 121a (see FIGS. 6 and 7) of mother substrate 121, the resistive-element paste is printed through screen printing or gravure printing or the like. Thus, resistive-element patterns made of the resistive-element paste are formed on upper surface 121a of mother substrate 121. At this time, the paste is printed so that these resistive-element patterns each overlap a portion of the base conductive layer which is to define and function as first upper surface conductor 24A and second upper surface conductor 24B.

Next, the resistive-element paste is baked (step ST6). Specifically, the work in process at this time is heated to a predetermined temperature to sinter the resistive-element paste printed on mother substrate 121. Consequently, the resistive-element pattern is baked on mother substrate 121 to form resistive element 22 on mother substrate 121.

Next, the resistive element is trimmed (step ST7). Specifically, resistive element 22 is irradiated with a laser beam to be partially removed. Thus, a trace of the removal in an L shape as seen in plan view (the portion indicated by a reference 22a shown in FIG. 3A) is formed in resistive element 22, and thus the resistance value of resistive element 22 is adjusted. For this trimming, a probe of a resistance meter is pressed against electrode portions 125A and 125B (see FIG. 7) provided separately on mother substrate 121 as will be described later herein. Under this condition, resistive element 22 is irradiated with the laser beam while the resistance value of resistive element 22 is monitored. In this way, fine adjustments of the resistance value of resistive elements 22 can be made.

Next, a protective film is applied (step ST8), and subsequently the applied protective film is hardened (step ST9). Specifically, protective film 23 is applied to cover resistive element 22 and a portion of the base conductive layer which is to define and function as first upper surface conductor 24A and second upper surface conductor 24B connected to resistive element 22. After this, the work in process at this time is heated to a predetermined temperature, and thus protective film 23 in the state of being attached to mother substrate 121 is hardened.

Next, the mother substrate is cut (step ST10). Specifically, mother substrate 121 is cut along predetermined cutting lines CL1 and CL2 (see FIGS. 6 and 7) by a method such as so-called push-cutting or dicing, into separate resistor devices 20A.

Next, plating is performed (step ST11). Specifically, the work in process at this time is immersed successively in an Ni plating bath and an Au plating bath to plate the base conductive layers formed in resistor device 20A, and thus the covering conductive layer is formed. Accordingly, the base conductive layers are covered with the plating layer containing Ni and the plating layer containing Ni is covered with the plating layer containing Au. Consequently, first upper surface conductor 24A to fourth upper surface conductor 24D as well as first lower surface conductor 25A to fourth lower surface conductor 25D are formed. In this way, production of resistor device 20A is completed.

Referring to FIG. 4, when capacitor device 10 is to be implemented on resistor device 20A, a joint member is printed first on resistor device 20A, capacitor device 10 is subsequently placed on resistor device 20A, and thereafter reflowing is performed. Specifically, first joint member 31 and second joint member 32 formed of a solder paste are printed by the screen printing method or the like to cover third upper surface conductor 24C and fourth upper surface conductor 24D, respectively. Capacitor device 10 is placed on resistor device 20A so that first external electrode 14A is located on first joint member 31 and second external electrode 14B is located on second joint member 32. After this, this work in process is placed in a reflow furnace or the like to perform soldering. Thus, third upper surface conductor 24C and first external electrode 14A are joined together by first joint member 31, and fourth upper surface conductor 24D and second external electrode 14B are joined together by second joint member 32. In this way, capacitor device 10 is implemented on resistor device 20A to produce composite electronic component 1A.

As shown in FIG. 6, in collective substrate 120A in the present preferred embodiment, mother substrate 121 which is to define and function as base 21 after being cut includes a plurality of to-be-product regions Ra and a to-be-cut-away region. To-be-product regions Ra are arranged in rows and columns and separated from each other, and are to define and function as resistor devices 20A after the mother substrate is cut. The to-be-cut-away region is in the form of a lattice located between the plurality of to-be-product regions Ra (the to-be-cut-away region includes a first region Rb1, a second region Rb2, and a third region Rb3 described later herein). While the substrate is preferably constructed and structured in this way, a certain layout of the conductive patterns on upper surface 121a of mother substrate 121 can be devised to ensure a high yield, namely the number of resistor devices 20A produced from one collective substrate, while avoiding upsizing of the to-be-cut-away region.

The following are details of this. FIG. 6 shows a state of mother substrate 121 after the hardening of the protective film (namely step ST9). For the sake of easy understanding of the configuration of collective substrate 120A in the present preferred embodiment, FIG. 7 shows a state of mother substrate 121 after baking of the resistive-element paste (namely step ST6). The X-axis direction and the Y-axis direction shown in FIGS. 6 and 7 represent one and the other of the row direction and the column direction in which a plurality of to-be-product regions Ra are arranged, and correspond to length direction L and width direction W of resistor device 20, respectively, as described above.

As shown in FIG. 6, upper surface 121a of mother substrate 121, except for an end region in the X-axis direction, is equipped with a plurality of conductive patterns (first conductive pattern P1 and second conductive pattern P2) substantially in an E shape as seen in plan view, a plurality of conductive patterns (third conductive pattern P3 and fourth conductive pattern P4) substantially in a rectangular shape as seen in plan view, a plurality of resistive elements 22, and a plurality of protective films 23.

A plurality of conductive patterns P1, P2 substantially in an E shape are arranged in rows and columns along the X-axis direction and the Y-axis direction. As to a plurality of conductive patterns P3, P4 substantially in a rectangular shape, a pair of conductive patterns P3, P4 is disposed inside respective conductive patterns P1, P2 substantially in an E shape, separated from conductive patterns P1, P2 and thus electrically insulated. More specifically, three sides of each of a plurality of conductive patterns P3, P4 substantially in a rectangular shape face respective portions of corresponding sides of a plurality of conductive patterns P1, P2 substantially in an E shape, and the remaining one side does not face the sides of a plurality of conductive patterns P1, P2 substantially in an E shape.

A plurality of resistive elements 22 are each disposed to overlap a pair of conductive patterns P1, P2 substantially in an E shape which are adjacent to each other in the X-axis direction. A plurality of protective films 23 are arranged to cover a plurality of resistive elements 22. Each of a plurality of protective films 23 further covers respective portions, connected to resistive element 22, of a plurality of conductive patterns P1, P2 in a substantially E shape.

As described above, a plurality of to-be-product regions Ra are arranged in rows and columns and separated from each other. A unit region VII is herein defined as a region including any one to-be-product region of a plurality of to-be-product regions Ra, and a frame region which is a portion of the to-be-cut-away region and which surrounds the one to-be-product region. This frame region includes a pair of first regions Rb1 adjacent to to-be-product region Ra in the X-axis direction, a pair of second regions Rb2 adjacent to to-be-product region Ra in the Y-axis direction, and four third regions Rb3 which are portions other than the pair of first regions Rb1 and the pair of second regions Rb2. In this case, one of a plurality of resistive elements 22, protective film 23, and conductive patterns P3, P4 substantially in a rectangular shape are disposed in to-be-product region Ra, and conductive patterns P1, P2 substantially in an E shape are disposed to abut on a portion of to-be-product region Ra, a portion of the pair of first regions Rb1, a portion of the pair of second regions Rb2, and a portion of four third regions Rb3, which are included in the frame region.

In the following, for the sake of easy understanding of the configuration of collective substrate 120A in the present preferred embodiment, a description will be given particularly of unit region VII shown in FIG. 6 and made up of to-be-product region Ra in which one of a plurality of resistive elements 22 is disposed and the frame region surrounding this to-be-product region Ra.

As shown in FIGS. 6 and 7, at respective two opposite sides of resistive element 22 in the X-axis direction, first conductive pattern P1 and second conductive pattern P2 which are each a conductive pattern substantially in an E shape are located. First conductive pattern P1 includes a terminal portion (first terminal portion) 124A which is to define and function as first upper surface conductor 24A, an electrode portion (first electrode portion) 125A to be used to measure the resistance value, and an interconnect portion 126A. Second conductive pattern P2 includes a terminal portion (second terminal portion) 124B which is to define and function as second upper surface conductor 24B, an electrode portion (second electrode portion) 125B to be used to measure the resistance value, and an interconnect portion 126B.

Both terminal portions 124A and 124B are located in to-be-product region Ra. Electrode portions 125A and 125B are each located in first region Rb1 and third region Rb3. Interconnect portions 126A and 126B are located in second region Rb2. Electrode portion 125A and electrode portion 125B each have an area larger than any of respective areas of terminal portion 124A and terminal portion 124B, and electrode portion 125A and electrode portion 125B are each a portion against which a probe of a resistance meter is pressed to trim the resistive element in above-described step ST7.

Third conductive pattern P3, which is one of the substantially rectangular conductive patterns, is to define and function as third upper surface conductor 24C, and is located between terminal portion 124A and electrode portion 125A of first conductive pattern P1. Fourth conductive pattern P4, which is the other substantially rectangular conductive pattern, is to define and function as fourth upper surface conductor 24D, and is located between terminal portion 124B and electrode portion 125B of second conductive pattern P2.

Terminal portions 124A and 124B are separated from each other in the X-axis direction, and resistive element 22 extends along the X-axis direction so that the opposite two ends of resistive element 22 are connected to respective terminal portions 124A, 124B.

First conductive pattern P1, second conductive pattern P2, third conductive pattern P3, and fourth conductive pattern P4 are arranged in this way to accomplish, in to-be-product region Ra, the layout of first upper surface conductor 24A to fourth upper surface conductor 24D on upper surface 21a of resistor device 20A. In addition, while electrical insulation of first conductive pattern P1 and second conductive pattern P2 respectively from third conductive pattern P3 and fourth conductive pattern P4 is maintained, terminal portion 124A is able to be electrically connected to electrode portion 125A and terminal portion 124B is able to be electrically connected to electrode portion 125B.

In other words, in collective substrate 120A in the present preferred embodiment, terminal portion 124A connected to resistive element 22 is extended in the Y-axis direction to be electrically connected to electrode portion 125A, through interconnect portion 126A disposed in second region Rb2 of the frame region which is the to-be-cut-away region. Thus, terminal portion 124A is separated from electrode portion 125A in the X-axis direction. Likewise, terminal portion 124B connected to resistive element 22 is extended in the Y-axis direction to be electrically connected to electrode portion 125B, through interconnect portion 126B disposed in second region Rb2 of the frame region which is the to-be-cut-away region. Thus, terminal portion 124B is separated from electrode portion 125B in the X-axis direction.

Collective substrate 120A constructed and structured in this way enables a higher yield of resistor devices 20A while avoiding upsizing of the to-be-cut-away region, as compared with the case where a different layout is used.

Moreover, as shown in FIG. 6, in collective substrate 120A constructed and structured in the above-described manner, the electrode portion connected to the terminal portion of one of a pair of to-be-product regions Ra adjacent to each other in the X-axis direction, and the electrode portion connected to the terminal portion of the other of the pair of to-be-product regions Ra are a common single electrode portion. In this way, the number of electrode portions is able to be reduced to approximately a half of the number of electrode portions which are provided separately rather than commonly. In this respect as well, a higher yield of resistor devices 20A is ensured while upsizing of the to-be-cut-away region is avoided.

Second Preferred Embodiment

Figure 8:
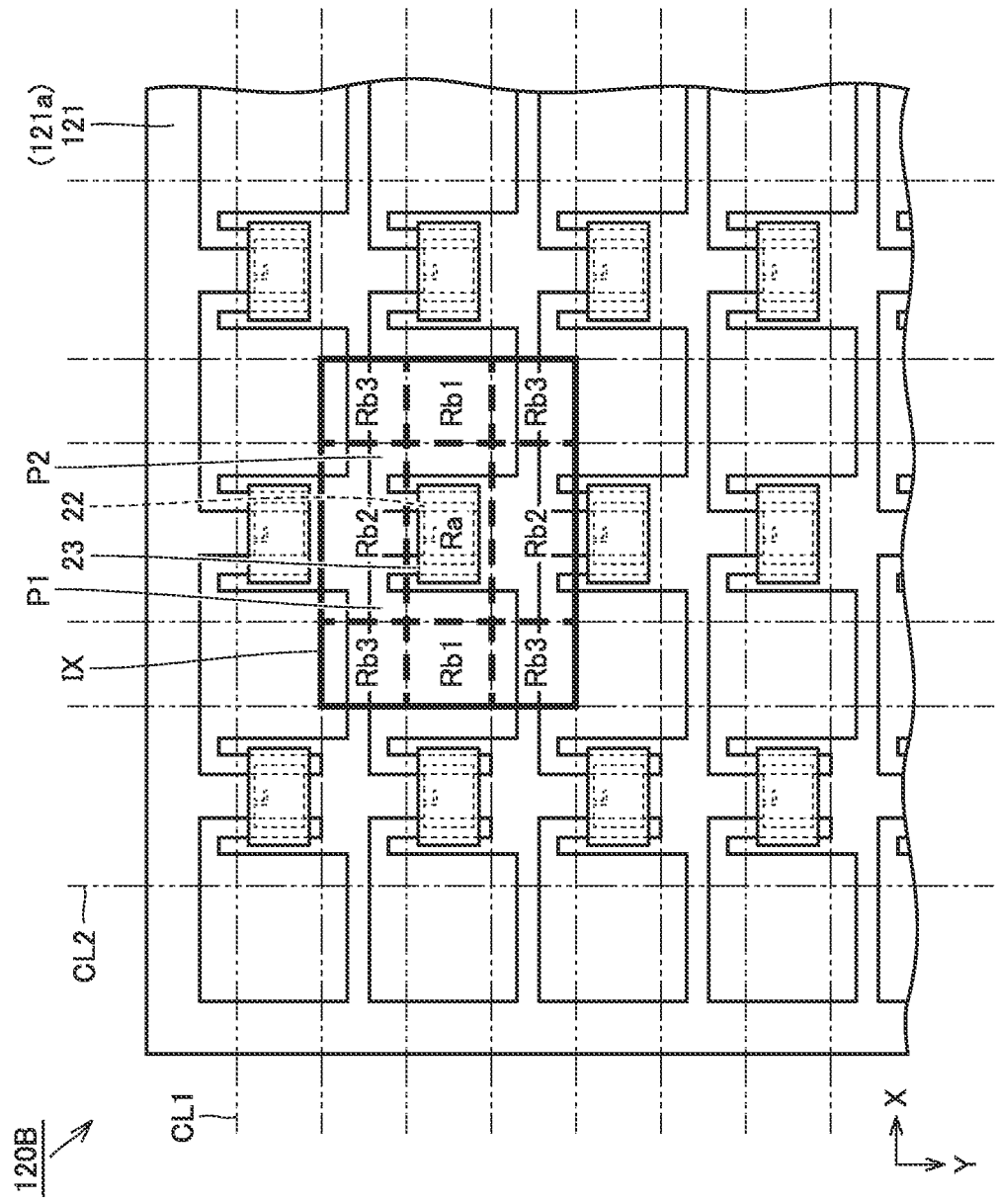
FIG. 8 is a schematic top view of a collective substrate for resistor devices according to a second preferred embodiment of the present invention.
Figure 9:
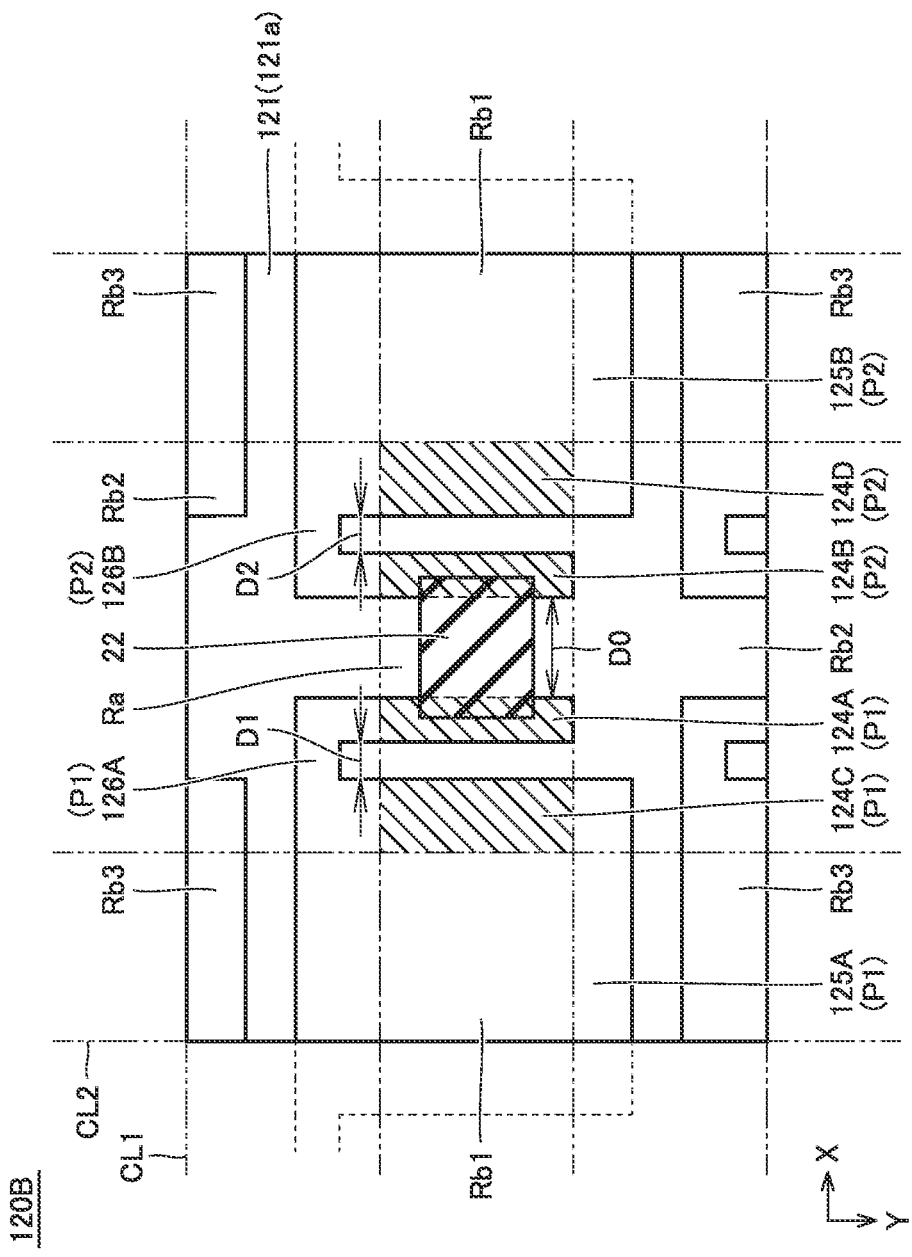
FIG. 9 is a schematic top view of the collective substrate for resistor devices shown in FIG. 8, showing a main portion of the substrate in an enlarged form.

FIG. 8 is a schematic top view of a collective substrate 120B according to a second preferred embodiment of the present invention, and FIG. 9 is a schematic top view showing, in an enlarged form, a unit region IX shown in FIG. 8. In the following, with reference to FIGS. 8 and 9, collective substrate 120B in the present preferred embodiment will be described. FIG. 8, like FIG. 6 as described above, shows a state of mother substrate 121 after the hardening of the protective film, and FIG. 9, like FIG. 7 as described above, shows a state of mother substrate 121 after baking of the resistive-element paste.

As shown in FIGS. 8 and 9, collective substrate 120B in the present preferred embodiment differs from collective substrate 120A in the first preferred embodiment in that collective substrate 120B does not include the substantially rectangular conductive patterns included in collective substrate 120A.

Specifically, as shown in FIG. 8, upper surface 121a of mother substrate 121, except for an end region in the X-axis direction, includes only a plurality of conductive patterns (first conductive pattern P1 and second conductive pattern P2) substantially in an E shape as seen in plan view, a plurality of resistive elements 22, and a plurality of protective films 23. A plurality of resistive elements 22 and a plurality of protective films 23 are disposed in respective to-be-product regions Ra, and conductive patterns P1, P2 substantially in an E shape are disposed to abut on a portion of to-be-product region Ra, a portion of the pair of first regions Rb1, a portion of the pair of second regions Rb2, and a portion of four third regions Rb3, which are included in the frame region.

In the following, for the sake of easy understanding of the configuration of collective substrate 120B in the present preferred embodiment, a description will be given particularly of unit region IX shown in FIG. 8 and including to-be-product region Ra in which one of a plurality of resistive elements 22 is disposed and the frame region surrounding this to-be-product region Ra.

As shown in FIGS. 8 and 9, at respective two opposite sides of resistive element 22 in the X-axis direction, first conductive pattern P1 and second conductive pattern P2 which are each a conductive pattern substantially in an E shape are located. First conductive pattern P1 includes a terminal portion (first terminal portion) 124A which is to define and function as first upper surface conductor 24A, an electrode portion (first electrode portion) 125A to be used to measure the resistance value, and an interconnect portion 126A. Second conductive pattern P2 includes a terminal portion (second terminal portion) 124B which is to define and function as second upper surface conductor 24B, an electrode portion (second electrode portion) 125B to be used to measure the resistance value, and an interconnect portion 126B.

Electrode portions 125A and 125B are each located in first region Rb1, third region Rb3, and to-be-product region Ra. A portion which is a portion of electrode portion 125A and which is located in to-be-product region Ra is a first portion 124C which is to define and function as the third upper surface conductor. Likewise, a portion which is a portion of electrode portion 125B and which is located in to-be-product region Ra is a second portion 124D which is to define and function as the fourth upper surface conductor. Namely, collective substrate 120B in the present preferred embodiment does not include third conductive pattern P3 and fourth conductive pattern P4 in a substantially rectangular shape that are included in collective substrate 120A in the first preferred embodiment, but includes electrode portion 125A and terminal portion 124A which directly face each other in the X-axis direction, and includes electrode portion 125B and terminal portion 124B which directly face each other in the X-axis direction.

By this arrangement of first conductive pattern P1 and second conductive pattern P2, the above-described layout of first upper surface conductor 24A to fourth upper surface conductor 24D on upper surface 21a of resistor device 20A is accomplished in to-be-product region Ra. In addition, terminal portion 124A is able to be electrically connected to electrode portion 125A, and terminal portion 124B is able to be electrically connected to electrode portion 125B.

In collective substrate 120B in the present preferred embodiment, electrode portion 125A abuts on both to-be-product regions Ra defining a pair of to-be-product regions Ra adjacent to first region Rb1 in which this electrode portion 125A is disposed. First portion 124C located in one of the to-be-product regions Ra is to define and function as third upper surface conductor 24C of resistor device 20A corresponding to the aforementioned one of the to-be-product regions Ra, and second portion 124D located in the other to-be-product region Ra is to define and function as fourth upper surface conductor 24D of resistor device 20A corresponding to the other to-be-product region Ra. Likewise, in collective substrate 120B in the present preferred embodiment, electrode portion 125B abuts on both to-be-product regions Ra defining a pair of to-be-product regions Ra adjacent to first region Rb1 in which this electrode portion 125B is disposed. Second portion 124D located in one of the to-be-product regions Ra is to define and function as fourth upper surface conductor 24D of resistor device 20A corresponding to the aforementioned one of the to-be-product regions Ra, and first portion 124C located in the other to-be-product region Ra is to define and function as third upper surface conductor 24C of resistor device 20A corresponding to the other to-be-product region Ra.

Collective substrate 12B constructed and structured in this way enables a further reduction of the to-be-cut-away region and a still higher yield of resistor devices 20A, in addition to the effects described in connection with the first preferred embodiment.

In collective substrate 120B constructed and structured in the above-described manner, a distance D1 in the X-axis direction between terminal portion 124A and electrode portion 125A connected to terminal portion 124A through interconnect portion 126A is smaller than a distance D0 in the X-axis direction between terminal portion 124A and terminal portion 124B (D1<D0). Likewise, a distance D2 in the X-axis direction between terminal portion 124B and electrode portion 125B connected to terminal portion 124B through interconnect portion 126B is smaller than distance D0 in the X-axis direction between terminal portion 124A and terminal portion 124B (D2<D0).

This configuration increases the area of resistive element to enhance the degree of freedom in adjusting electrical characteristics of resistive element 22, and significantly reduces the to-be-cut-away region. The aforementioned condition(s) D1<D0 and/or D2<D0 is also applicable to the layout of the conductive patterns like that of the above-described first preferred embodiment.

Regarding the foregoing first and second preferred embodiments of the present invention, the description is given above of an example where respective interconnect portions extended along the Y-axis direction from respective first upper surface conductor portion and second upper surface conductor portion are extended in the same direction. However, the interconnect portions may be extended in respective directions opposite to each other along the Y-axis, like a third preferred embodiment described later herein.

Moreover, regarding the foregoing first and second preferred embodiments of the present invention, the description is given above of an example where two ceramic green sheets are laminated to form an LTCC substrate which is used as a mother substrate, in order to form internal connection conductors as embedded interconnections in the base. However, naturally a single-layer substrate without embedded interconnections may be used as the mother substrate, like the third preferred embodiment described below.

Third Preferred Embodiment

Figure 10:
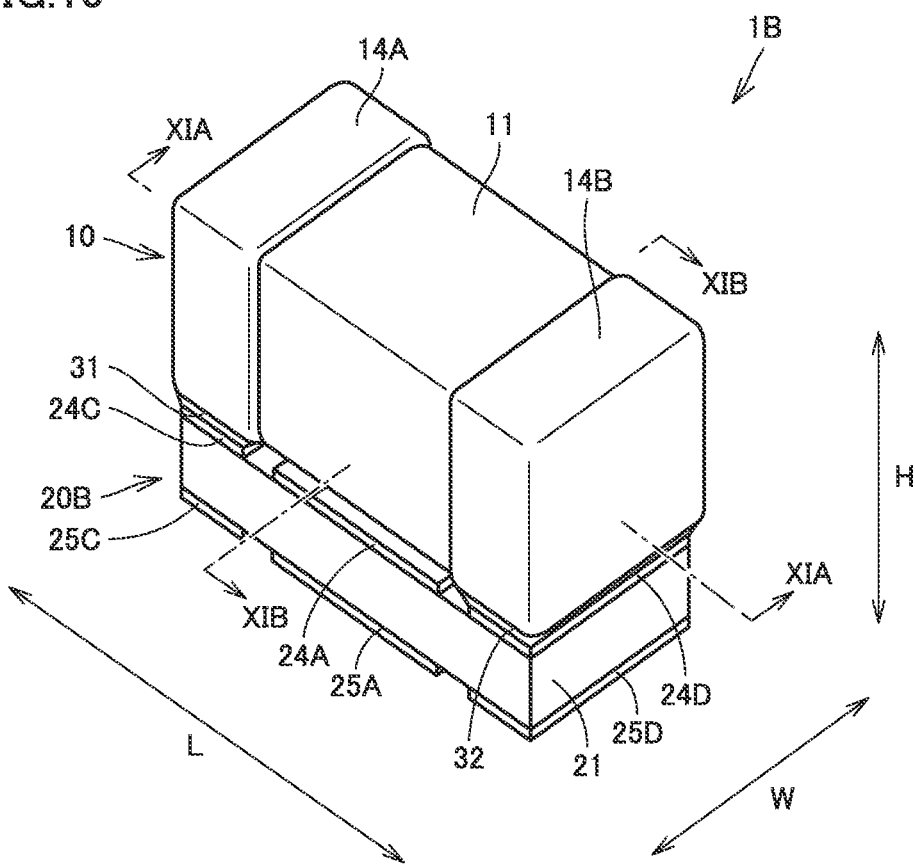
FIG. 10 is a schematic perspective view of a composite electronic component including a resistor device manufactured using a collective substrate for resistor devices according to a third preferred embodiment of the present invention.
Figure 11A:
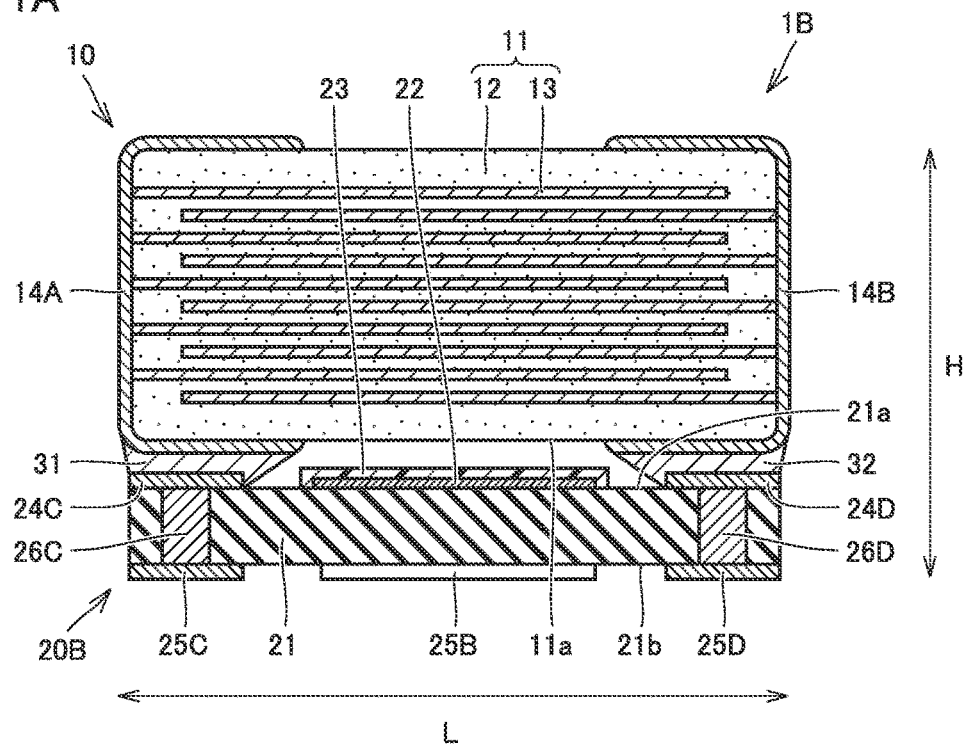
FIGS. 11A and 11B are each a schematic cross-sectional view of the composite electronic component shown in FIG. 10.
Figure 11B:
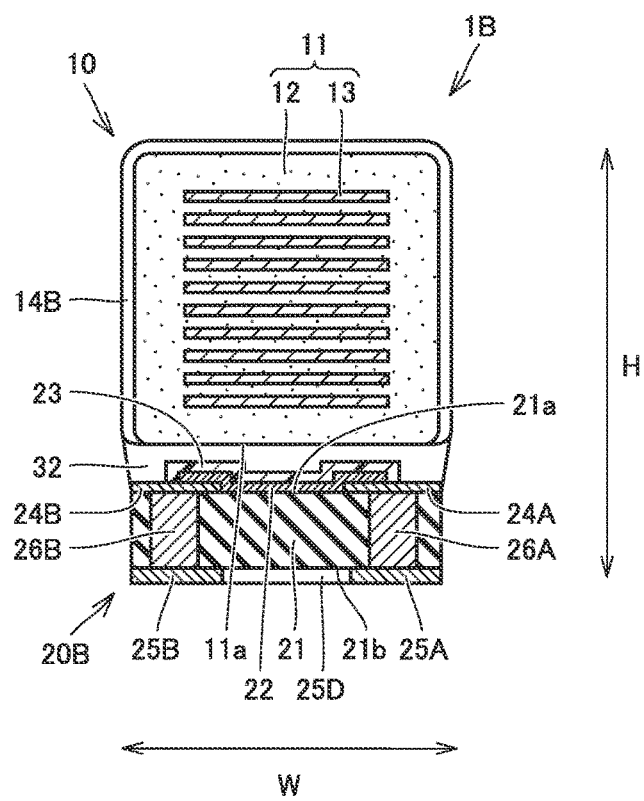

FIG. 10 is a schematic perspective view of a composite electronic component 1B including a resistor device 20B manufactured using a collective substrate 120C (see FIGS. 13 and 14) according to the third preferred embodiment of the present invention. FIGS. 11A and 11B are schematic cross-sectional views of composite electronic component 1B along a line XIA-XIA and a line XIB-XIB shown in FIG. 10, respectively. FIGS. 12A and 12B are a schematic top view and a schematic bottom view, respectively, of resistor device 20B shown in FIG. 10.

Before a description of collective substrate 120C in the present preferred embodiment, a description will be given of resistor device 20B manufactured using collective substrate 120C, and of composite electronic component 1B including this resistor device 20B, with reference to FIGS. 10 to 12.

As shown in FIGS. 10 to 11B, composite electronic component 1B includes capacitor device 10 as a first electronic device and resistor device 20B as a second electronic device.

As shown in FIGS. 10 to 12B, resistor device 20B differs from above-described resistor device 20A mainly in terms of respective positions at which first upper surface conductor 24A, second upper surface conductor 24B, first lower surface conductor 25A, and second lower surface conductor 25B are arranged, as well as respective positions at which first connection conductor 26A and second connection conductor 26B are arranged and the configuration of the connection conductors.

As shown in FIGS. 11A to 12B, particularly in FIG. 12A, first upper surface conductor 24A and second upper surface conductor 24B are both disposed on upper surface 21a of base 21. First upper surface conductor 24A and second upper surface conductor 24B each preferably have a rectangular or substantially rectangular shape having its dimension in length direction L larger than its dimension in width direction W when resistor device 20B is seen in plan view along height direction H.

First upper surface conductor 24A and second upper surface conductor 24B are separated from each other in width direction W with the center of base 21 located therebetween. First upper surface conductor 24A is disposed on an end at a side of a third side surface, along width direction W of base 21. Second upper surface conductor 24B is disposed on an end at a side of a fourth side surface, along width direction W of base 21. First upper surface conductor 24A and second upper surface conductor 24B are located between third upper surface conductor 24C and fourth upper surface conductor 24D in length direction L.

As shown in FIGS. 11A to 12B, particularly in FIG. 12B, first lower surface conductor 25A and second lower surface conductor 25B are both disposed on lower surface 21b of base 21. First lower surface conductor 25A and second lower surface conductor 25B each preferably have a rectangular or substantially rectangular shape having its dimension in length direction L larger than its dimension in width direction W when resistor device 20B is seen in plan view along height direction H.

First lower surface conductor 25A and second lower surface conductor 25B are separated from each other in width direction W with the center of base 21 located therebetween. First lower surface conductor 25A is disposed on an end at a side of the third side surface, along width direction W of base 21. Second lower surface conductor 25B is disposed on an end at a side of the fourth side surface, along width direction W of base 21. First lower surface conductor 25A and second lower surface conductor 25B are located between third lower surface conductor 25C and fourth lower surface conductor 25D in length direction L. First lower surface conductor 25A is opposite to first upper surface conductor 24A with base 21 interposed therebetween, and second lower surface conductor 25B is opposite to second upper surface conductor 24B with base 21 interposed therebetween.

As shown in FIGS. 11A to 12B, first connection conductor 26A and second connection conductor 26B are disposed in base 21. First connection conductor 26A includes a via conductor extending through base 21 in height direction H, to connect first upper surface conductor 24A and first lower surface conductor 25A to each other. Second connection conductor 26B includes a via conductor extending through base 21 in height direction H, to connect second upper surface conductor 24B and second lower surface conductor 25B.

As shown in FIGS. 11A to 12B, particularly in FIG. 12A, resistive element 22 is mainly located between a region where first upper surface conductor 24A is disposed and a region where second upper surface conductor 24B is disposed, in width direction W. As seen in plan view in height direction H, one end of resistive element 22 in width direction W overlaps a portion of first upper surface conductor 24A, and the other end of resistive element 22 in width direction W overlaps a portion of second upper surface conductor 24B. Thus, first upper surface conductor 24A and second upper surface conductor 24B are connected to resistive element 22.

Protective film 23 covers resistive element 22 on upper surface 21a of base 21, a portion of first upper surface conductor 24A, and a portion of second upper surface conductor 24B.

Figure 14:
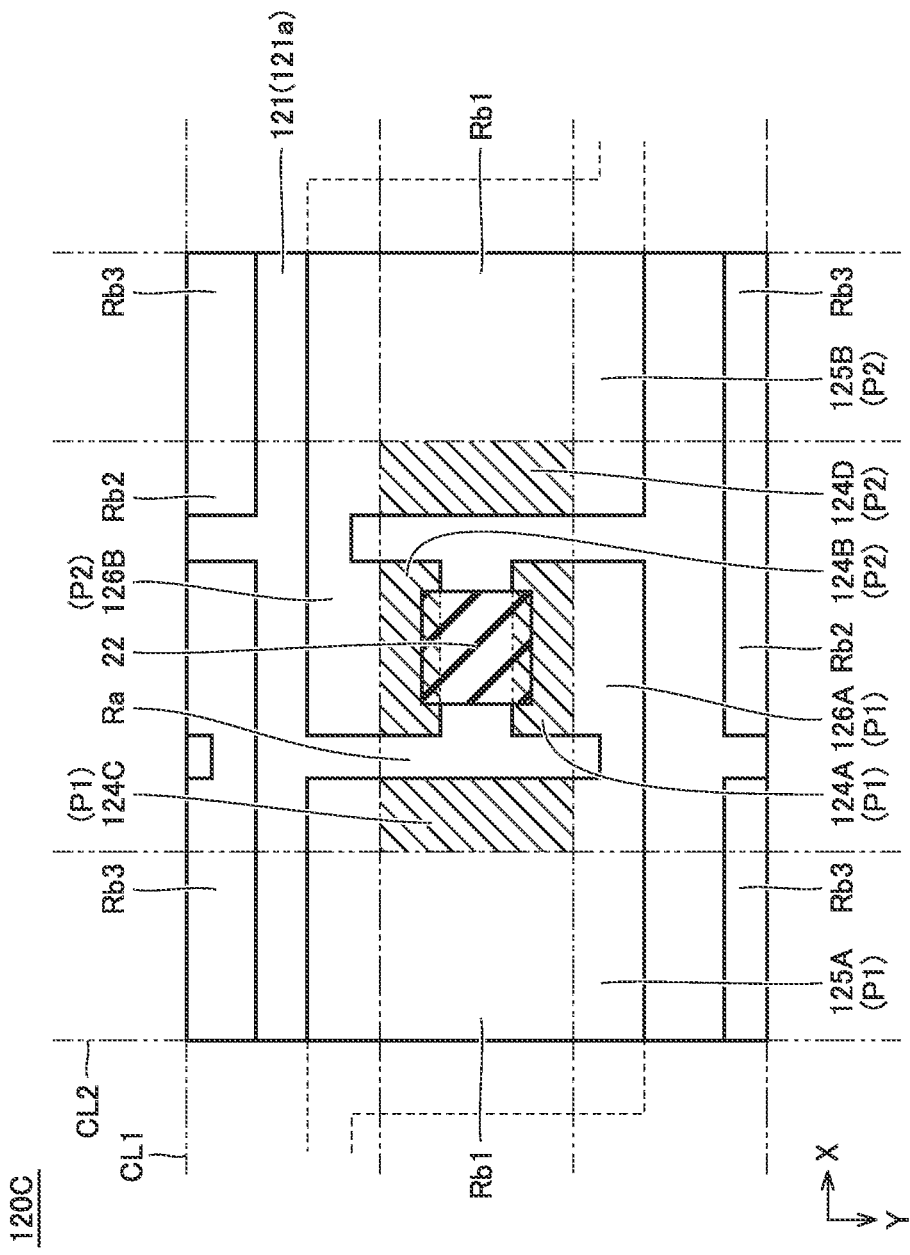
FIG. 14 is a schematic top view of the collective substrate for resistor devices shown in FIG. 13, showing a main portion of the substrate in an enlarged form.

FIG. 13 is a schematic top view of collective substrate 120C according to the present preferred embodiment, and FIG. 14 is a schematic top view showing, in an enlarged form, a unit region XIV shown in FIG. 13. In the following, with reference to FIGS. 13 and 14, collective substrate 120C in the present preferred embodiment will be described. FIG. 13, like FIG. 6 as described above, shows a state of mother substrate 121 after the hardening of the protective film, and FIG. 14, like FIG. 7 as described above, shows a state of mother substrate 121 after baking of the resistive-element paste.

As shown in FIGS. 13 and 14, collective substrate 120C in the present preferred embodiment differs from collective substrate 120B in the second preferred embodiment, in terms of respective positions at which terminal portions 124A and 124B are arranged in to-be-product region Ra.

Specifically, as shown in FIG. 13, upper surface 121a of mother substrate 121, except for an end region in the X-axis direction, is equipped with a plurality of conductive patterns (first conductive pattern P1 and second conductive pattern P2) substantially in an S shape as seen in plan view, a plurality of resistive elements 22, and a plurality of protective films 23. A plurality of resistive elements 22 and a plurality of protective films 23 are disposed in respective to-be-product regions Ra, and conductive patterns P1, P2 substantially in an S shape are disposed to abut on a portion of to-be-product region Ra, a pair of first regions Rb1, a portion of a pair of second regions Rb2, and a portion of four third regions Rb3, which are included in the frame region.

In the following, for the sake of easy understanding of the configuration of collective substrate 120C in the present preferred embodiment, a description will be given particularly of unit region XIV shown in FIG. 13 and including to-be-product region Ra in which one of a plurality of resistive elements 22 is disposed and the frame region surrounding this to-be-product region Ra.

As shown in FIGS. 13 and 14, at respective two opposite sides of resistive element 22 in the X-axis direction, first conductive pattern P1 and second conductive pattern P2 which are each a conductive pattern substantially in an E shape are located. First conductive pattern P1 includes a terminal portion (first terminal portion) 124A which is to define and function as first upper surface conductor 24A, an electrode portion (first electrode portion) 125A to be used to measure the resistance value, and an interconnect portion 126A. Second conductive pattern P2 includes a terminal portion (second terminal portion) 124B which is to define and function as second upper surface conductor 24B, an electrode portion (second electrode portion) 125B to be used to measure the resistance value, and an interconnect portion 126B.

A first portion 124C included in electrode portion 125A and located in to-be-product region Ra is to define and function as the third upper surface conductor. Likewise, a second portion 124D included in electrode portion 125B and located in to-be-product region Ra is to define and function as the fourth upper surface conductor.

Terminal portions 124A and 124B are separated from each other in the Y-axis direction, and resistive element 22 extends along the Y-axis direction so that its two opposite ends are connected to respective terminal portions 124A, 124B.

This configuration also enables similar effects to those of the second preferred embodiment to be obtained. Namely, the above-described layout of first upper surface conductor 24A to fourth upper surface conductor 24D on upper surface 21a of resistor device 20B is accomplished in to-be-product region Ra. In addition, terminal portion 124A is able to be electrically connected to electrode portion 125A, and terminal portion 124B is able to be electrically connected to electrode portion 125B.

Regarding the present preferred embodiment, the description is given above of an example where first portion 124C which is to define and function as the third upper surface conductor is disposed in electrode portion 125A, and second portion 124D which is to define and function as the fourth upper surface conductor is disposed in electrode portion 125B. The third upper surface conductor and fourth upper surface conductor may also include third conductive pattern P3 and fourth conductive pattern P4 separated from first conductive pattern P1 and second conductive pattern P2 as described above in connection with the first preferred embodiment.

Regarding the foregoing first to third preferred embodiments of the present invention, the collective substrate is illustrated which is to be divided into separate sections to obtain respective resistor devices each integrated with a capacitor device into a composite electronic component, and applications of the present invention to the collective substrate are illustrated. The electronic device to be implemented on the resistor device is not limited to the capacitor device and may be any of other electronic devices such as inductor device, thermistor device, piezoelectric device, or the like.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A collective substrate for resistor devices, the collective substrate comprising:
   a base including:
      a plurality of to-be-product regions arranged in rows and columns and separated from each other; and
      a to-be-cut-away region in a lattice shape located between the plurality of to-be-product regions;
   a plurality of resistive elements disposed on an upper surface of the base; and
   a plurality of first conductive patterns disposed on the upper surface of the base; wherein
   each of the plurality of resistive elements is disposed in a corresponding to-be-product region of the plurality of to-be-product regions;
   each of the plurality of first conductive patterns is disposed in a corresponding unit region of a plurality of unit regions defined as a region including one to-be-product region of the plurality of to-be-product regions, and a frame region which is a portion of the to-be-cut-away region and surrounds the one to-be-product region;
   the frame region in each of the plurality of unit regions includes:
      a first region adjacent to the to-be-product region in a first direction; and
      a second region adjacent to the to-be-product region in a second direction;
      the first direction being one of a row direction and a column direction in which the plurality of to-be-product regions are arranged, and the second direction being the other of the row direction and the column direction; and
   the first conductive pattern in each of the plurality of unit regions includes:
      a first terminal portion connected to the resistive element and disposed in the to-be-product region;
      a first electrode portion disposed at least in the first region and larger in area than the first terminal portion; and a first interconnect portion extended from the first terminal portion toward the second region and connected to the first electrode portion through only the frame region.

2. The collective substrate for resistor devices according to claim 1, further comprising:
a plurality of second conductive patterns disposed on the upper surface of the base and separated from each of the plurality of first conductive patterns; wherein
each of the plurality of second conductive patterns is disposed in a corresponding unit region of the plurality of unit regions; and
the second conductive pattern in each of the plurality of unit regions includes:
a second terminal portion connected to the resistive element and disposed in the to-be-product region;
a second electrode portion disposed at least in the first region and larger in area than the second terminal portion; and
a second interconnect portion extended from the second terminal portion toward the second region and connected to the second electrode portion through only the frame region.

3. The collective substrate for resistor devices according to claim 2, wherein in each of the plurality of unit regions, the first terminal portion and the second terminal portion are separated from each other in the first direction.

4. The collective substrate for resistor devices according to claim 3, wherein in each of the plurality of unit regions:
the first electrode portion includes a first portion located in the to-be-product region and continuing from a portion of the first electrode portion located in the first region; and
the second electrode portion includes a second portion located in the to-be-product region and continuing from a portion of the second electrode portion located in the first region; and
in each of the plurality of unit regions:
the first portion is separated from the first terminal portion in the first direction; and
the second portion is separated from the second terminal portion in the first direction.

5. The collective substrate for resistor devices according to claim 3, further comprising:
a plurality of third conductive patterns disposed on the upper surface of the base, and separated from each of the plurality of first conductive patterns and from each of the plurality of second conductive patterns; and
a plurality of fourth conductive patterns disposed on the upper surface of the base, and separated from each of the plurality of first conductive patterns and from each of the plurality of second conductive patterns;
the plurality of third conducive patterns are each disposed in a corresponding unit region of the plurality of unit regions;
the plurality of fourth conductive patterns are each disposed in a corresponding unit region of the plurality of unit regions;
in each of the plurality of unit regions:
the third conductive pattern is disposed in a portion of the to-be-product region located between the first terminal portion and the first electrode portion; and
the fourth conductive pattern is disposed in a portion of the to-be-product region located between the second terminal portion and the second electrode portion.

6. The collective substrate for resistor devices according to claim 3, wherein in each of the plurality of unit regions:
a distance in the first direction between the first terminal portion and the first electrode portion and a distance in the first direction between the second terminal portion and the second electrode portion are each smaller than a distance in the first direction between the first terminal portion and the second terminal portion.

7. The collective substrate for resistor devices according to claim 2, wherein in each of the plurality of unit regions, the first terminal portion and the second terminal portion are separated from each other in the second direction.

8. The collective substrate for resistor devices according to claim 7, wherein in each of the plurality of unit regions:
the first electrode portion includes a first portion located in the to-be-product region and continuing from a portion of the first electrode portion located in the first region; and
the second electrode portion includes a second portion located in the to-be-product region and continuing from a portion of the second electrode portion located in the first region; and
in each of the plurality of unit regions:
the first portion is separated from the first terminal portion in the first direction; and
the second portion is separated from the second terminal portion in the first direction.

9. The collective substrate for resistor devices according to claim 7, further comprising:
a plurality of third conductive patterns disposed on the upper surface of the base, and separated from each of the plurality of first conductive patterns and from each of the plurality of second conductive patterns; and
a plurality of fourth conductive patterns disposed on the upper surface of the base, and separated from each of the plurality of first conductive patterns and from each of the plurality of second conductive patterns;
the plurality of third conducive patterns are each disposed in a corresponding unit region of the plurality of unit regions;
the plurality of fourth conductive patterns are each disposed in a corresponding unit region of the plurality of unit regions;
in each of the plurality of unit regions:
the third conductive pattern is disposed in a portion of the to-be-product region located between the first terminal portion and the first electrode portion; and
the fourth conductive pattern is disposed in a portion of the to-be-product region located between the second terminal portion and the second electrode portion.

10. The collective substrate for resistor devices according to claim 2, wherein the first electrode portion connected to the first terminal portion of one to-be-product region of a pair of to-be-product regions which are adjacent to each other in the first direction, and the second electrode portion connected to the second terminal portion of the other to-be-product region of the pair of to-be-product regions are a single common electrode portion.

11. The collective substrate for resistor devices according to claim 2, further comprising a plurality of protective films disposed on the upper surface of the base; wherein
the plurality of protective films are each disposed in a corresponding to-be-product region of the plurality of to-be-product regions; and
in each of the plurality of unit regions, the protective film covers the resistive element, at least a portion of the first terminal portion, and at least a portion of the second terminal portion.

12. A composite electronic component that is manufactured using the collective substrate for resistor devices according to claim 1.

13. The composite electronic component according to claim 12, further comprising a capacitor device and the resistor devices.

14. The composite electronic component according to claim 13, wherein the capacitor is located on the resistor device.

15. The composite electronic component according to claim 13, wherein the capacitor device is a multilayer ceramic capacitor.

16. The composite electronic component according to claim 12, wherein each of the resistor devices includes upper surface conductors, lower surface conductors, and connection conductors.

17. The composite electronic component according to claim 12, further comprising one of an inductor device, a thermistor device, and a piezoelectric device.

* * * * *